US012751164B2

(12) United States Patent
Shin et al.

(10) Patent No.: US 12,751,164 B2
(45) Date of Patent: Sep. 29, 2026

(54) DISPLAY DEVICE

(71) Applicant: Samsung Display Co., Ltd., Yongin-si (KR)

(72) Inventors: Dong Hee Shin, Yongin-si (KR); Sun Kwun Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 318 days.

(21) Appl. No.: 18/482,717

(22) Filed: Oct. 6, 2023

(65) Prior Publication Data

US 2024/0164164 A1 May 16, 2024

(30) Foreign Application Priority Data

Nov. 14, 2022 (KR) ........................ 10-2022-0151406

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02); *H10K 59/1216* (2023.02)

(58) Field of Classification Search
CPC ......................... H10K 59/1213; H10K 59/131
See application file for complete search history.

(56) References Cited

U.S. PATENT DOCUMENTS 11,894,395 B2 2/2024 Kim
12,002,821 B2 6/2024 Kim et al.
2010/0182303 A1 7/2010 Takasugi et al.
2012/0229438 A1 9/2012 Fujita
2016/0055804 A1 2/2016 Kitadani et al.
2018/0102400 A1* 4/2018 Choi .................... H10K 59/126
2020/0168686 A1 5/2020 Han et al.
2022/0367596 A1 11/2022 Chen et al.
2023/0225165 A1 7/2023 Chen et al.

FOREIGN PATENT DOCUMENTS

CN 111951729 A 11/2020
CN 112967682 A 6/2021
CN 114267283 A 4/2022
(Continued)

OTHER PUBLICATIONS

Extended European Search Report dated Aug. 1, 2024 for corresponding European Application No. 23209529.9 (9 pages).
(Continued)

*Primary Examiner* — Yu-Hsi D Sun
(74) *Attorney, Agent, or Firm* — Womble Bond Dickinson (US) LLP

(57) ABSTRACT

A display device includes a substrate, a first voltage line in a first metal layer on the substrate and extending in a first direction, a horizontal gate line in a second metal layer on the first metal layer and extending in a second direction crossing the first direction, a pixel circuit of a first pixel and a pixel circuit of a second pixel in the first metal layer, the second metal layer, and an active layer between the first and second metal layers, and a shielding line connected to the first voltage line and extending in the second direction, the shielding line being located between the pixel circuit of the first pixel and the pixel circuit of the second pixel.

19 Claims, 18 Drawing Sheets

(56) References Cited

FOREIGN PATENT DOCUMENTS

| | | | |
|---|---|---|---|
| JP | 2017-151447 | A | 8/2017 |
| JP | 2018-055118 | A | 4/2018 |
| KR | 10-2016-0002337 | A | 1/2016 |
| KR | 10-2018-0036818 | A | 4/2018 |
| KR | 10-2020-0060941 | A | 6/2020 |
| KR | 10-2022-0060019 | A | 5/2022 |
| KR | 10-2022-0097685 | A | 7/2022 |
| WO | WO 2021-227758 | A1 | 11/2021 |

OTHER PUBLICATIONS

Korean Office Action for KR Application No. 10-2022-0151406, dated Jul. 1, 2026, 11 pages.

* cited by examiner

VGL: VGLn-3, VGLn-2, VGLn-1, VGLn
HGL: HGLn-1, HGLn

MTL1: VDL, CPE1, CPE3, SHD
ACTL: DE1, ACT1, SE1, ACTE1, CPE2, CPE4
MTL2: CE1, CE6, GE1

MTL1: VDL, CPE3, VIL, DL2
ACTL: DE2, ACT2, SE2, ACTE2, CPE4
MTL2: CE9, CE8, GE2

MTL1: VDL, CPE1, CPE3, SHD1
ACTL: DE1, ACT1, SE1, SE2, CPE2, CPE4
MTL2: CE5, GE1, SHD2

MTL1: VIL, DL2
ACTL: ACTE3, DE2
MTL2: BGL, VSL
MTL3: RME1, RME2
MTL4: CTE1, CTE4, CTE5

MTL1: VIL, DL2
ACTL: ACTE3, DE2
MTL2: BGL, VSL
MTL3: RME1, RME2
MTL4: CTE1, CTE4, CTE5

MTL1: VDL, CPE3
ACTL: DE1, ACT1, SE1, ACTE2, CPE4
MTL2: CE6, GE1, VSL
MTL3: AND
MTL4: CAT

DISPLAY DEVICE

CROSS-REFERENCE TO RELATED APPLICATION

This application claims priority to and the benefit of Korean Patent Application No. 10-2022-0151406, filed on Nov. 14, 2022, in the Korean Intellectual Property Office, the entire content of which is incorporated by reference herein.

BACKGROUND

1. Field

The present disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device and an organic light emitting display device. Among the flat panel display devices, in the light emitting display device, because each of the pixels of a display panel includes a light emitting element capable of emitting light by itself, an image can be displayed without a backlight unit providing light to the display panel. The light emitting element may be an organic light emitting diode (OLED) using an organic material as a fluorescent material or an inorganic light emitting diode using an inorganic material as a fluorescent material.

SUMMARY

Aspects and features of embodiments of the present disclosure provide a display device capable of reducing or preventing horizontal crosstalk by reducing or minimizing coupling capacitance between adjacent pixel circuits.

However, aspects and features of embodiments of the present disclosure are not restricted to the one set forth herein. The above and other aspects of the present disclosure will become more apparent to one of ordinary skill in the art to which the present disclosure pertains by referencing the detailed description of the present disclosure given below.

According to one or more embodiments of the present disclosure, a display device includes a substrate, a first voltage line in a first metal layer on the substrate and extending in a first direction, a horizontal gate line in a second metal layer on the first metal layer and extending in a second direction crossing the first direction, a pixel circuit of a first pixel and a pixel circuit of a second pixel in the first metal layer, the second metal layer, and an active layer between the first and second metal layers, and a shielding line connected to the first voltage line and extending in the second direction, the shielding line being located between the pixel circuit of the first pixel and the pixel circuit of the second pixel.

The pixel circuit of the first pixel may include a first capacitor electrode at one side of the shielding line in the first metal layer, and a second capacitor electrode in the active layer and overlapping the first capacitor electrode. The pixel circuit of the second pixel may include a third capacitor electrode at an other side of the shielding line in the first metal layer, and a fourth capacitor electrode in the active layer and overlapping the third capacitor electrode.

The shielding line may be in the first metal layer and integrally formed with the first voltage line.

The pixel circuit of the first pixel may further include a first transistor. The first transistor of the first pixel may include a drain electrode in the active layer and electrically connected to the first voltage line, a source electrode in the active layer and integrally formed with the second capacitor electrode, and a gate electrode in the second metal layer.

The display device may further include a first connection electrode in the second metal layer and electrically connecting the first voltage line to the drain electrode of the first transistor, and a second connection electrode in the second metal layer, integrally formed with the gate electrode of the first transistor, and connected to the first capacitor electrode.

The display device may further include a first active extension in the active layer and extending from the second capacitor electrode, a first electrode in a third metal layer on the second metal layer and connected to the first active extension, a first contact electrode in a fourth metal layer on the third metal layer and connected to the first electrode, and a light emitting element connected to the first contact electrode.

The display device may further include a second electrode parallel to the first electrode in the third metal layer, a second contact electrode in the fourth metal layer and connected to the light emitting element, and a second voltage line extending in the second direction in the second metal layer and connected to the second electrode.

The display device may further include a first active extension in the active layer and extending from the second capacitor electrode, a first electrode in a third metal layer on the second metal layer and extending in the first direction, a first contact electrode in a fourth metal layer on the third metal layer, connected to the first active extension, and insulated from the first electrode, and a light emitting element connected to the first contact electrode.

The display device may further include a first active extension in the active layer and extending from the second capacitor electrode, a pixel electrode in a third metal layer on the second metal layer and connected to the first active extension; a light emitting layer on the pixel electrode, a common electrode on the light emitting layer, and a second voltage line extending in the second direction in the second metal layer and connected to the common electrode.

The shielding line may include a first shielding line in the first metal layer and integrally formed with the first voltage line, and a second shielding line in the second metal layer and overlapping the first shielding line.

The pixel circuit of the first pixel may include a first capacitor electrode at one side of the first shielding line in the first metal layer, and a second capacitor electrode in the active layer and overlapping the first capacitor electrode. The pixel circuit of the second pixel may include a third capacitor electrode at an other side of the first shielding line in the first metal layer, and a fourth capacitor electrode in the active layer and overlapping the third capacitor electrode.

The pixel circuit of the first pixel further may include a first transistor. The first transistor of the first pixel may include a drain electrode in the active layer and electrically connected to the first voltage line, a source electrode in the active layer and integrally formed with the second capacitor electrode, and a gate electrode in the second metal layer.

The display device may further include a first connection electrode in the second metal layer and electrically connecting the first voltage line to the drain electrode of the first transistor, and a second connection electrode in the second metal layer, integrally formed with the gate electrode of the first transistor, and connected to the first capacitor electrode.

The second shielding line may be in the second metal layer and integrally formed with the first connection electrode.

According to one or more embodiments of the present disclosure, a display device includes a substrate, a first voltage line in a first metal layer on the substrate and extending in a first direction, a pixel circuit of a first pixel and a pixel circuit of a second pixel in the first metal layer, an active layer on the first metal layer, and a second metal layer on the active layer, and a shielding line in the first metal layer, the shielding line being integrally formed with the first voltage line, and located between the pixel circuit of the first pixel and the pixel circuit of the second pixel.

The pixel circuit of the first pixel may include a first capacitor electrode at one side of the shielding line in the first metal layer, and a second capacitor electrode in the active layer and overlapping the first capacitor electrode. The pixel circuit of the second pixel may include a third capacitor electrode at an other side of the shielding line in the first metal layer, and a fourth capacitor electrode in the active layer and overlapping the third capacitor electrode.

The pixel circuit of the first pixel further may include a first transistor. The first transistor of the first pixel may include a drain electrode in the active layer and electrically connected to the first voltage line, a source electrode in the active layer and integrally formed with the second capacitor electrode, and a gate electrode in the second metal layer.

According to an embodiment of the disclosure, a display device includes a substrate, a first voltage line in a first metal layer on the substrate and extending in a first direction, a pixel circuit of a first pixel and a pixel circuit of a second pixel in the first metal layer, an active layer on the first metal layer, and a second metal layer on the active layer, and a shielding line between the pixel circuit of the first pixel and the pixel circuit of the second pixel. The shielding line include a first shielding line in the first metal layer and integrally formed with the first voltage line, and a second shielding line in the second metal layer and overlapping the first shielding line.

The pixel circuit of the first pixel may include a first capacitor electrode at one side of the first shielding line in the first metal layer, and a second capacitor electrode in the active layer and overlapping the first capacitor electrode. The pixel circuit of the second pixel may include a third capacitor electrode at an other side of the first shielding line in the first metal layer, and a fourth capacitor electrode in the active layer and overlapping the third capacitor electrode.

The pixel circuit of the first pixel may further include a first transistor. The first transistor of the first pixel may include a drain electrode in the active layer and electrically connected to the first voltage line, a source electrode in the active layer and integrally formed with the second capacitor electrode, and a gate electrode in the second metal layer.

In the display device according to embodiments, a shielding line between a pixel circuit of a first pixel and a pixel circuit of a second pixel may be included to minimize coupling capacitance between the pixel circuit of the first pixel and the pixel circuit of the second pixel and prevent horizontal crosstalk, thereby improving image quality.

However, effects according to the embodiments of the present disclosure are not limited to those exemplified above and various other effects are incorporated herein.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
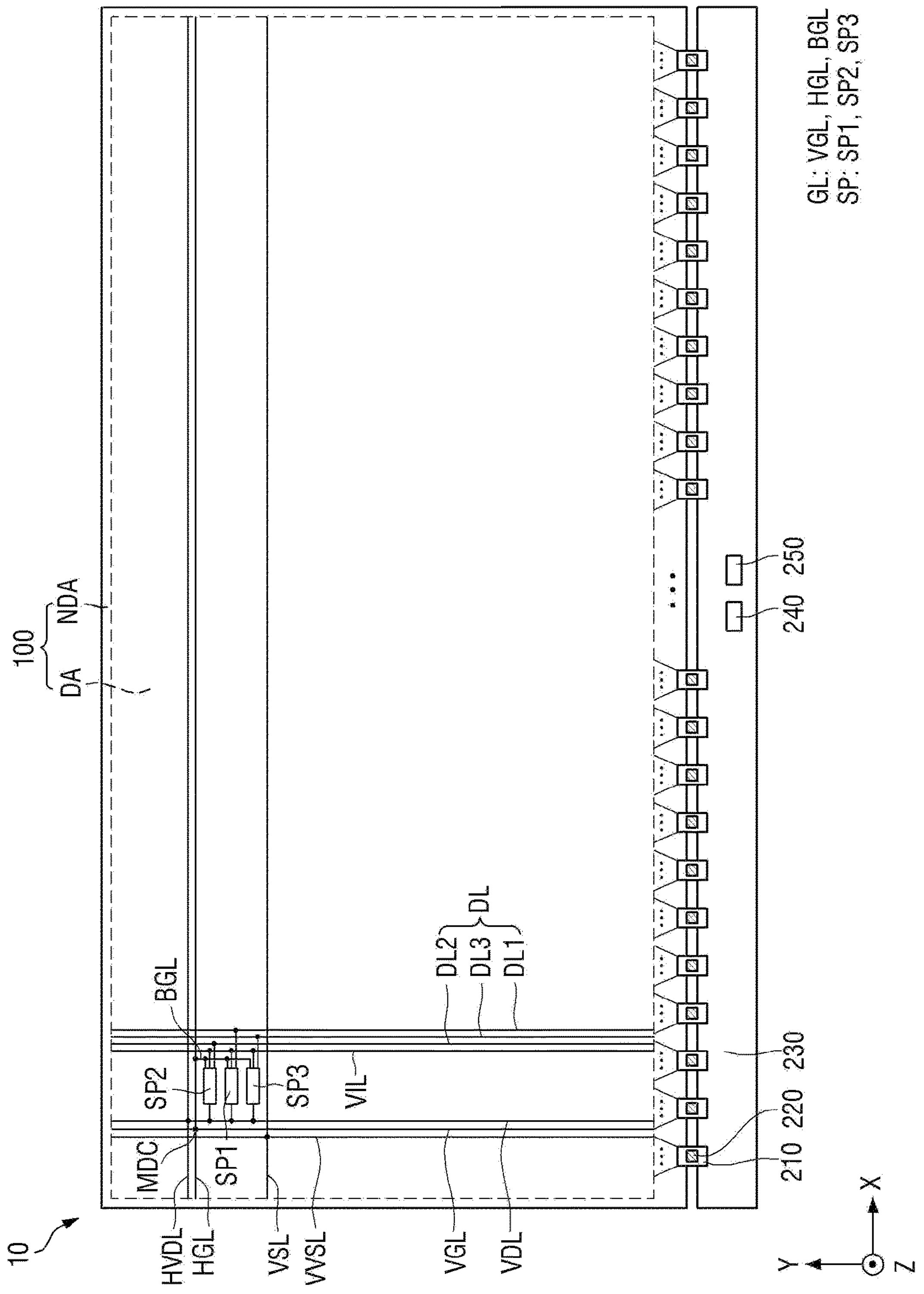
FIG. 1 is a plan view illustrating a display device according to one or more embodiments.

In the following description, for the purposes of explanation, numerous specific details are set forth in order to provide a thorough understanding of various embodiments or implementations of the present disclosure. As used herein "embodiments" and "implementations" are interchangeable words that are non-limiting examples of devices or methods employing one or more of the present disclosure disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive nor limit the present disclosure. For example, specific shapes, configurations, and characteristics of an embodiment may be used or implemented in other embodiments without departing from the spirit and scope of the present disclosure.

Unless otherwise specified, the illustrated embodiments are to be understood as providing features of varying detail of some ways in which the present disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the spirit and scope of the present disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-axis, Y-axis, and Z-axis, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z," "at least one selected from the group consisting of X, Y, and Z," "at least one of X, Y, or Z," and "at least one selected from among X, Y, and Z," may be construed as X only, Y only, Z only, or any combination of two or more of X, Y, and Z, such as, for instance, XYZ, XYY, YZ, ZZ, or the like. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the spirit and scope of the present disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, one or more embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and/or the like, which may be formed using semiconductor-based fabrication techniques and/or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the spirit and scope of the present disclosure. Further, the blocks, units, parts, and/or modules of one or more embodiments may be physically combined into more complex blocks, units, parts, and/or modules without departing from the spirit and scope of the present disclosure.

Unless otherwise defined or implied herein, all terms (including technical and scientific terms) used herein have the same meaning as commonly understood by those skilled in the art to which the present disclosure pertains. It will be further understood that terms, such as those defined in commonly used dictionaries, should be interpreted as having a meaning that is consistent with their meaning in the context of the relevant art and the present disclosure, and should not be interpreted in an ideal or excessively formal sense unless clearly so defined herein.

Hereinafter, detailed embodiments of the present disclosure is described with reference to the accompanying drawings.

FIG. 1 is a plan view illustrating a display device according to one or more embodiments.

The terms "upper," "top" and "top surface" as used herein refer to an upward direction (i.e., a Z-axis direction) with respect to the display device. The terms "lower," "bottom" and "bottom surface" as used herein refer to a downward direction (i.e., a direction opposite to the Z-axis direction) with respect to the display device. Further, the terms "left," "right," "upper," and "lower" respectively indicate corresponding directions on the surface of the display device. For example, the term "left" indicates a direction opposite to an X-axis direction, the term "right" indicates the X-axis direction, the term "upper" indicates a Y-axis direction, and the term "lower" indicates a direction opposite to the Y-axis direction.

Referring to FIG. 1, a display device 10, as a device for displaying a moving or still image, may be employed as a display screen of various products such as a television, a laptop computer, a monitor, a billboard, and an Internet of Things (IoT) device as well as portable electronic devices such as a mobile phone, a smartphone, a tablet personal computer (PC), a smart watch, a watch phone, a mobile communication terminal, an electronic notebook, an eBook reader, a portable multimedia player (PMP), a navigation device, and/or an ultra-mobile PC (UMPC).

The display device 10 may include a display panel 100, a flexible film 210, a display driver 220, a circuit board 230, a timing controller 240, and a power supply unit 250.

The display panel 100 may have a rectangular shape in a plan view. For example, the display panel 100 may have a rectangular shape, in a plan view, having long sides in a first direction (X-axis direction) and short sides in a second direction (Y-axis direction). A corner formed by the long side in the first direction (X-axis direction) and the short side in the second direction (Y-axis direction) may be right-angled or rounded with a suitable curvature (e.g., a predetermined curvature). The planar shape of the display panel 100 is not limited to the rectangular shape, and may be formed in another polygonal shape, a circular shape or an elliptical shape. For example, the display panel 100 may be formed to be flat, but is not limited thereto. In another example, the display panel 100 may be bent with a suitable curvature (e.g., a predetermined curvature).

The display panel 100 may include a display area DA and a non-display area NDA.

The display area DA, which is an area for displaying an image, may be defined as the central area of the display panel 100. The display area DA may include a pixel SP, a gate line GL, a data line DL, an initialization voltage line VIL, a first voltage line VDL, a horizontal voltage line HVDL, and a vertical voltage line VVSL, and a second voltage line VSL. The pixel SP may be formed in each pixel area at intersections of the data lines DL and the gate lines GL. The pixels SP may include first to third pixels SP1, SP2, and SP3. Each of the first to third pixels SP1, SP2, and SP3 may be connected to one horizontal gate line HGL and one data line DL. Each of the first to third pixels SP1, SP2, and SP3 may be defined as a minimum unit area that outputs light.

Each of the first to third pixels SP1, SP2, and SP3 may include an organic light emitting diode (OLED) having an organic light emitting layer, a quantum dot light emitting diode (LED) including a quantum dot light emitting layer, a micro LED, or an inorganic LED having an inorganic semiconductor.

The first pixel SP1 may emit light of a first color such as red light, the second pixel SP2 may emit light of a second color such as green light, and the third pixel SP3 may emit light of a third color such as blue light. The pixel circuits of the third pixel SP3, the first pixel SP1 and the second pixel SP2 may be arranged along the second direction (Y-axis direction), but the arrangement direction of the pixel circuits is not limited thereto.

The gate line GL may include the vertical gate line VGL, the horizontal gate line HGL, and the auxiliary gate line BGL.

The vertical gate lines VGL may be connected to a display driver 220 to extend in the second direction (Y-axis direction) and may be spaced from each other in the first direction (X-axis direction). The vertical gate lines VGL may be disposed in parallel with the data lines DL. The horizontal gate lines HGL may extend in the first direction (X-axis direction) and may be spaced from each other in the second direction (Y-axis direction). Each of the horizontal gate lines HGL may cross the vertical gate lines VGL. For example, one horizontal gate line HGL may be connected to one of the vertical gate lines VGL through a contact portion MDC. The contact portion MDC may correspond to a portion in which the horizontal gate line HGL is inserted into the contact hole and contacts the vertical gate line VGL. An auxiliary gate line BGL may extend from the horizontal gate line HGL to supply gate signals to first to third pixels SP1, SP2, and SP3.

The data lines DL may extend in the second direction (Y-axis direction) and may be spaced from each other in the first direction (X-axis direction). The data lines DL may include first to third data lines DL1, DL2, and DL3. Each of the first to third data lines DL1, DL2, and DL3 may supply a data voltage to each of the first to third pixels SP1, SP2, and SP3.

The initialization voltage lines VIL may extend in the second direction (Y-axis direction) and may be spaced from each other in the first direction (X-axis direction). The initialization voltage line VIL may supply the initialization voltage received from the display driver 220 to the pixel circuit of each of the first to third pixels SP1, SP2, and SP3. The initialization voltage line VIL may receive a sensing signal from the pixel circuit of each of the first to third pixels SP1, SP2, and SP3 to supply the sensing signal the display driver 220.

The first voltage lines VDL may extend in the second direction (Y-axis direction) and may be spaced from each other in the first direction (X-axis direction). The first voltage line VDL may supply a driving voltage or a high potential voltage received from a power supply unit 250 to the first to third pixels SP1, SP2, and SP3.

Horizontal voltage lines HVDL may extend in the first direction (X-axis direction) and may be spaced from each other in the second direction (Y-axis direction). The horizontal voltage line HVDL may be connected to the first voltage line VDL. The horizontal voltage line HVDL may receive a driving voltage or a high potential voltage from the first voltage line VDL.

The vertical voltage lines VVSL may extend in the second direction (Y-axis direction) and may be spaced from each other in the first direction (X-axis direction). The vertical voltage line VVSL may be connected to the second voltage line VSL. The vertical voltage line VVSL may supply the low potential voltage received from the power supply unit 250 to the second voltage line VSL.

The second voltage lines VSL may extend in the first direction (X-axis direction) and may be spaced from each other in the second direction (Y-axis direction). The second voltage line VSL may supply a low potential voltage to the first to third pixels SP1, SP2, and SP3.

The connection relationship between the pixel SP, the gate line GL, the data line DL, the initialization voltage line VIL, the first voltage line VDL, and the second voltage line VSL may be changed in design according to the number and arrangement of the pixels SP.

The non-display area NDA may be defined as the remaining area of the display panel 100 except the display area DA. For example, the non-display area NDA may include fan-out lines connecting the vertical gate line VGL, the data line DL, the initialization voltage line VIL, the first voltage line VDL, and the vertical voltage line VVSL to the display driver 220, and a pad portion connected to the flexible film 210.

Input terminals provided on one side of the flexible film 210 may be attached to the circuit board 230 by a film attaching process, and output terminals provided at the other side of the flexible film 210 may be attached to the pad portion by the film attaching process. For example, the flexible film 210 may be bent like a tape carrier package or a chip on film. The flexible film 210 may be bent toward the lower portion of the display panel 100 to reduce the bezel area of the display device 10.

The display driver 220 may be mounted on the flexible film 210. For example, the display driver 220 may be implemented as an integrated circuit (IC). The display driver 220 may receive digital video data and a data control signal from the timing controller 240, and according to the data control signal, convert the digital video data to an analog data voltage to supply it to the data lines DL through the fan-out lines. The display driver 220 may generate a gate signal according to a gate control signal supplied from the timing controller 240, and sequentially supply the gate signal to the vertical gate lines VGL in a set order. Accordingly, the display driver 220 may concurrently (e.g., simultaneously) function as a data driver and a gate driver. Because the display device 10 includes the display driver 220 disposed on the lower side of the non-display area NDA, sizes of the left side, right side, and upper side of the non-display area NDA may be reduced or minimized.

A circuit board 230 may support a timing controller 240 and the power supply unit 250, and supply signals and power to the display driver 220. For example, the circuit board 230 may supply a signal supplied from the timing controller 240 and a power voltage supplied from the power supply unit 250 to the display driver 220 to display an image on each pixel. To this end, a signal line and a power line may be provided on the circuit board 230.

The timing controller 240 may be mounted on the circuit board 230 and receive image data and a timing synchronization signal supplied from the display driving system or a graphic device through a user connector provided on the circuit board 230. The timing controller 240 may generate digital video data by arranging the image data to fit the pixel arrangement structure based on the timing synchronization signal, and may supply the generated digital video data to the display driver 220. The timing controller 240 may generate the data control signal and the gate control signal based on the timing synchronization signal. The timing controller 240 may control the data voltage supply timing of the display driver 220 based on the data control signal, and may control the gate signal supply timing of the display driver 220 based on the gate control signal.

The power supply unit 250 may be disposed on the circuit board 230 to supply a power voltage to the display driver 220 and the display panel 100. For example, the power supply unit 250 may generate a driving voltage or a high potential voltage and supply it to the first voltage line VDL, may generate a low potential voltage and supply it to the vertical voltage line VVSL, and may generate an initialization voltage and supply it to the initialization voltage line VIL.

Figure 2:
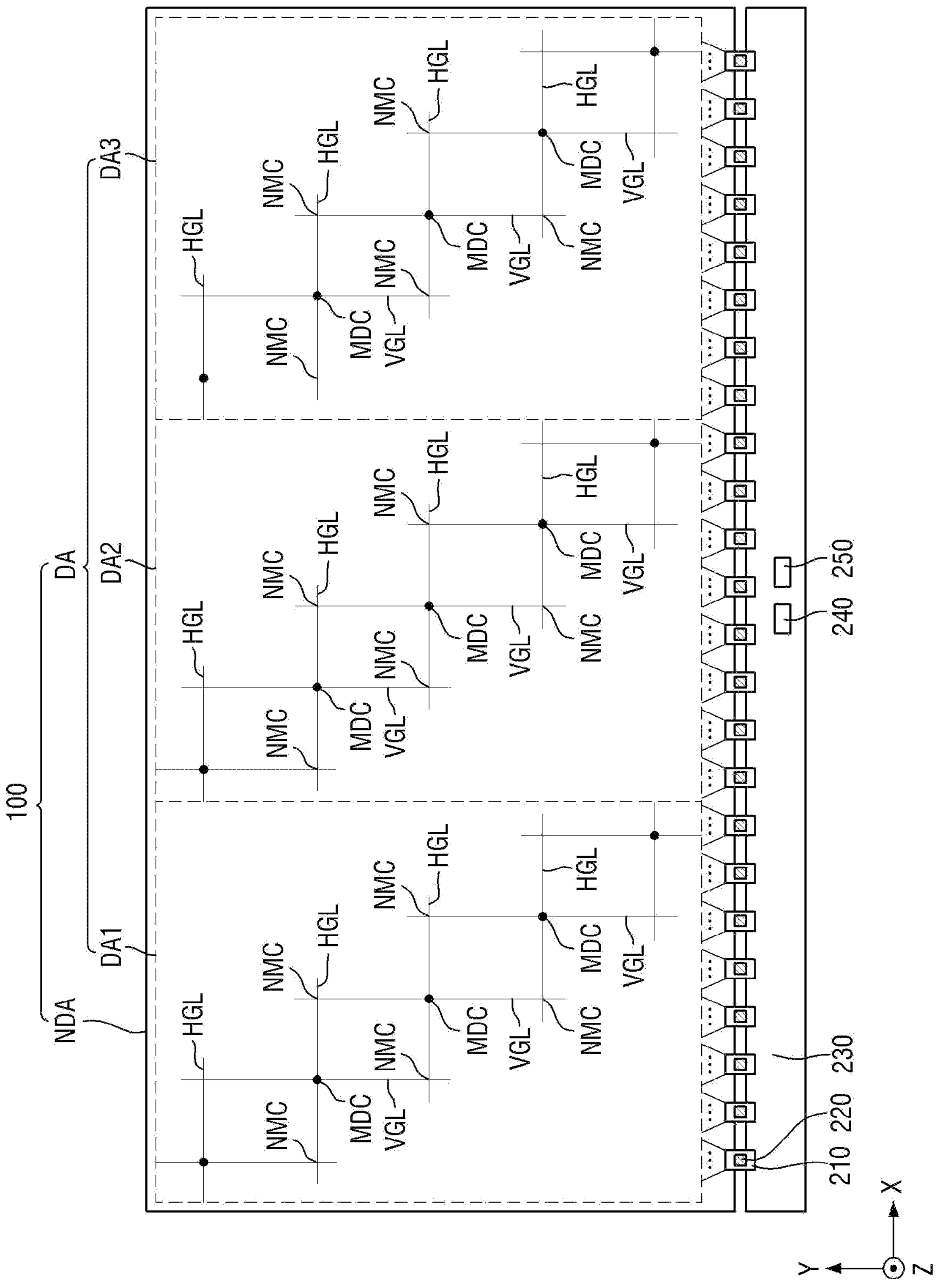
FIG. 2 is a plan view illustrating a contact portion of a vertical gate line and a horizontal gate line in a display device according to one or more embodiments.

FIG. 2 is a plan view illustrating a contact portion of a vertical gate line and a horizontal gate line in a display device according to one embodiment.

Referring to FIG. 2, the display area DA may include first to third display areas DA1, DA2, and DA3.

Each of the horizontal gate lines HGL may intersect the vertical gate lines VGL. The horizontal gate line HGL may cross the vertical gate lines VGL in the contact portion MDC and a non-contact portion NMC. For example, one horizontal gate line HGL may be connected to one of the vertical gate lines VGL through a contact portion MDC. One horizontal gate line HGL may be insulated from the other vertical gate lines VGL in the non-contact portion NMC.

The contact portion MDC of a first display area DA1 may be disposed on an extension line (i.e., a virtual line) extending from the upper left end of the first display area DA1 to the lower right end of the first display area DA1. The contact portion MDC of a second display area DA2 may be disposed on an extension line (i.e., a virtual line) extending from the upper left end of the second display area DA2 to the lower right end of the second display area DA2. The contact portion MDC of a third display area DA3 may be disposed on an extension line (i.e., a virtual line) extending from the upper left end of the third display area DA3 to the lower right end of the third display area DA3. Accordingly, the contact portions MDC may be arranged along a diagonal direction between the first direction (X-axis direction) and a direction opposite to the second direction (Y-axis direction) in each of the first to third display areas DA1, DA2, and DA3.

The display device 10 may include the display driver 220 that functions as a data driver and a gate driver. Accordingly, because the data line DL receives a data voltage from the display driver 220 disposed on the lower side of the non-display area NDA, and the vertical gate line VGL receives the gate signal from the display driver 220 disposed on the lower side of the non-display area NDA, the display device 10 may reduce or minimize the sizes of the left side, right side, and upper side of the non-display area NDA.

Figure 3:
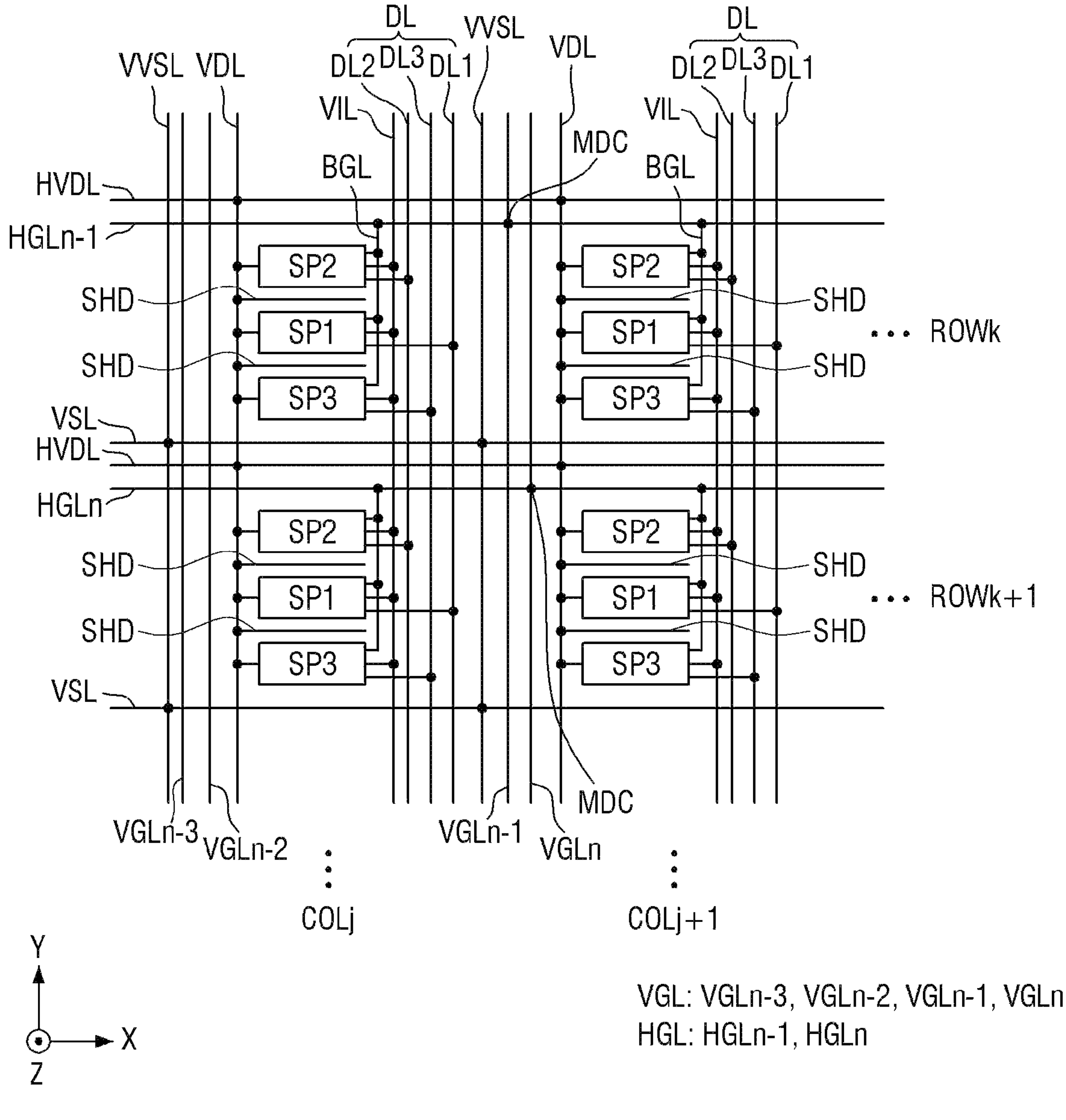
FIG. 3 is a diagram illustrating pixels and lines of a display device according to one or more embodiments.

FIG. 3 is a diagram illustrating pixels and lines of a display device according to one or more embodiments.

Referring to FIG. 3, the pixels SP may include first to third pixels SP1, SP2, and SP3. The pixel circuits of the third pixel SP3, the first pixel SP1, and the second pixel SP2 may be arranged along the second direction (Y-axis direction), but the arrangement direction of the pixel circuits is not limited thereto.

Each of the first to third pixels SP1, SP2, and SP3 may be connected to the first voltage line VDL, the initialization voltage line VIL, the gate line GL, and the data line DL.

A first voltage line VDL may extend in the second direction (Y-axis direction). The first voltage line VDL may be disposed on the left side of the pixel circuits of the first to third pixels SP1, SP2, and SP3. The first voltage line VDL may supply a driving voltage or high potential voltage to a transistor of each of the first to third pixels SP1, SP2, and SP3.

A shielding line SHD may extend from the first voltage line VDL in the first direction (X-axis direction). The shielding line SHD may be integrally formed with the first voltage line VDL, but is not limited thereto. The shielding line SHD may receive a driving voltage or a high potential voltage from the first voltage line VDL. The shielding line SHD may be disposed between the pixel circuit of the second pixel SP2 and the pixel circuit of the first pixel SP1 to reduce coupling capacitance between the pixel circuit of the second pixel SP2 and the pixel circuit of the first pixel SP1. The shielding line SHD may be disposed between the pixel circuit of the first pixel SP1 and the pixel circuit of the third pixel SP3 to reduce coupling capacitance between the pixel circuit of the first pixel SP1 and the pixel circuit of the third pixel SP3.

The horizontal voltage line HVDL may extend in the first direction (X-axis direction). The horizontal voltage line HVDL may be disposed to the upper side of the horizontal gate line HGL. The horizontal voltage line HVDL may be connected to the first voltage line VDL. The horizontal voltage line HVDL may receive a driving voltage or a high potential voltage from the first voltage line VDL.

The initialization voltage line VIL may extend in the second direction (Y-axis direction). The initialization voltage line VIL may be disposed on the right side of the auxiliary gate line BGL. The initialization voltage line VIL may be disposed between the auxiliary gate line BGL and the data line DL. The initialization voltage line VIL may supply an initialization voltage to the pixel circuit of each of the first to third pixels SP1, SP2, and SP3. The initialization voltage line VIL may receive a sensing signal from the pixel circuit of each of the first to third pixels SP1, SP2, and SP3 to supply the sensing signal the display driver 220.

The gate line GL may include the vertical gate line VGL, the horizontal gate line HGL, and the auxiliary gate line BGL.

The vertical gate lines VGL may extend in the second direction (Y-axis direction). At least one vertical gate line VGL may be disposed between adjacent pixels SP. The vertical gate line VGL may be connected between the display driver 220 and the horizontal gate line HGL. Each of the vertical gate lines VGL may cross the horizontal gate lines HGL. The vertical gate line VGL may supply the gate signal received from the display driver 220 to the horizontal gate line HGL.

For example, an $(n-3)^{th}$ vertical gate line VGLn-3 (where n is an integer greater than or equal to 4) and an $(n-2)^{th}$ vertical gate line VGLn−2 may be disposed to the left side of the pixel SP disposed on a $j^{th}$ column COLj (where j is a positive integer). The vertical gate lines VGL may be disposed side by side at the left side of the first voltage line VDL. An $(n-1)^{th}$ vertical gate line VGLn−1 and an $n^{th}$ vertical gate line VGLn may be disposed between the pixel SP disposed on the $j^{th}$ column COLj and the pixel SP disposed on a $(j+1)^{th}$ column COLj+1. The $(n-1)^{th}$ vertical gate line VGLn−1 may be connected to the $(n-1)^{th}$ horizontal gate line HGLn−1 through the contact portion MDC, and may be insulated from the remaining horizontal gate lines HGL. The $n^{th}$ vertical gate line VGLn may be connected to the $n^{th}$ horizontal gate line HGLn through the contact portion MDC, and may be insulated from the remaining horizontal gate lines HGL. The $(n-1)^{th}$ and $n^{th}$ vertical gate lines VGLn−1 and VGLn may be disposed between the data line DL connected to the pixel SP disposed in the $j^{th}$ column COLj and the first voltage line VDL connected to the pixel SP disposed in the $(j+1)^{th}$ column COLj+1.

The horizontal gate line HGL may extend in a first direction (X-axis direction). The horizontal gate line HGL may be disposed to the upper side of the pixel circuit of the second pixel SP2. The horizontal gate line HGL may be connected between the vertical gate line VGL and the auxiliary gate line BGL. The horizontal gate line HGL may supply a gate signal received from the vertical gate line VGL to the auxiliary gate line BGL.

For example, the $(n-1)^{th}$ horizontal gate line HGLn−1 may be disposed on the upper side of the pixel circuit of the second pixel SP2 disposed in the $k^{th}$ row ROWk (k being a positive integer). The $(n-1)^{th}$ horizontal gate line HGLn−1 may be connected to the $(n-1)^{th}$ vertical gate line VGLn−1 through the contact portion MDC, and may be insulated from the remaining vertical gate lines VGL. The $n^{th}$ horizontal gate line HGLn may be disposed on the upper side of the pixel circuit of the second pixel SP2 disposed in the $(k+1)^{th}$ row ROWk+1. The $n^{th}$ horizontal gate line HGLn may be connected to the $n^{th}$ vertical gate line VGLn through the contact portion MDC and may be insulated from the remaining vertical gate lines VGL.

The auxiliary gate line BGL may extend from the horizontal gate line HGL in a direction opposite to the second direction (Y-axis direction). The auxiliary gate line BGL may be disposed on the right side of the pixel circuits of the first to third pixels SP1, SP2, and SP3. The auxiliary gate line BGL may supply the gate signals received from the horizontal gate line HGL to the pixel circuits of the first to third pixels SP1, SP2, and SP3.

The data lines DL may extend in the second direction (the Y-axis direction). The data lines DL may supply a data voltage to the pixels SP. The data lines DL may include first to third data lines DL1, DL2, and DL3.

The second data line DL2 may extend in the second direction (Y-axis direction). The second data line DL2 may be disposed on the right side of the initialization voltage line VIL. The second data line DL2 may supply the data voltage received from the display driver 220 to the pixel circuit of the second pixel SP2.

The third data line DL3 may extend in the second direction (Y-axis direction). The third data line DL3 may be disposed on the right side of the second data line DL2. The third data line DL3 may supply the data voltage received from the display driver 220 to the pixel circuit of the third pixel SP3.

The first data line DL1 may extend in the second direction (Y-axis direction). The first data line DL1 may be disposed on the right side of the third data line DL3. The first data line DL1 may supply the data voltage received from the display driver 220 to the pixel circuit of the first pixel SP1.

The vertical voltage line VVSL may extend in the second direction (Y-axis direction). The vertical voltage line VVSL may be disposed to the left side of the vertical gate line VGL. The vertical voltage line VVSL may be connected between the power supply unit 250 and the second voltage line VSL. The vertical voltage line VVSL may supply the low potential voltage supplied from the power supply unit 250 to the second voltage line VSL.

The second voltage line VSL may extend in the first direction (X-axis direction). The second voltage line VSL may be disposed to the lower side of the pixel circuit of the third pixel SP3. The second voltage line VSL may supply the low potential voltage received from the vertical voltage line VVSL to a light emitting element layer of the first to third pixels SP1, SP2, and SP3.

Figure 4:
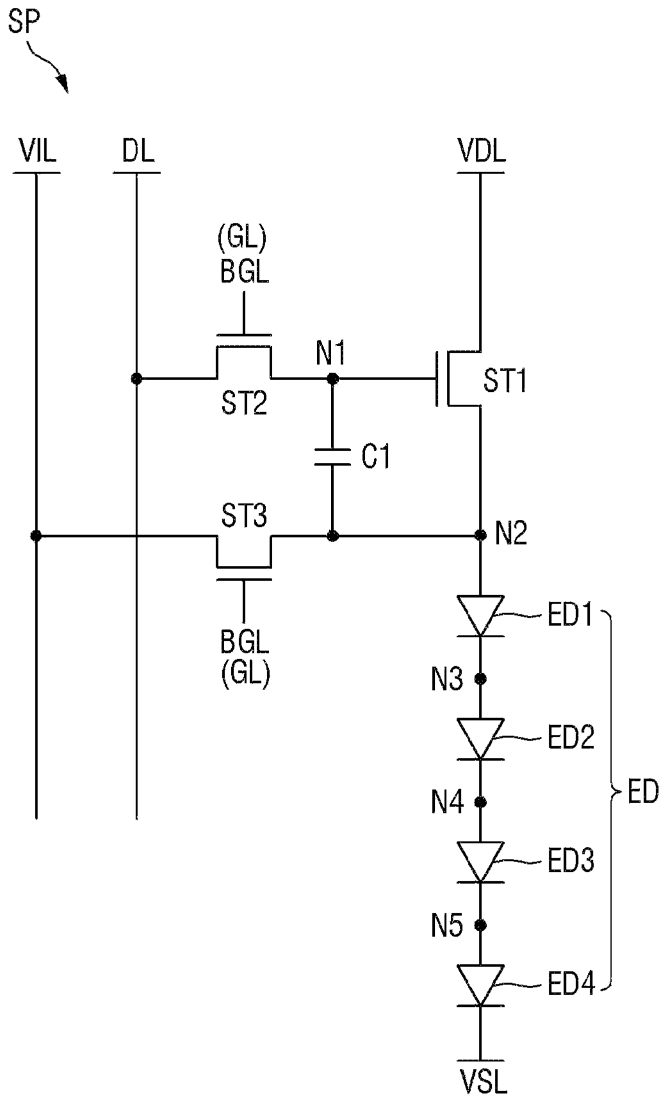
FIG. 4 is a circuit diagram illustrating a pixel of a display device according to one or more embodiments.

FIG. 4 is a circuit diagram illustrating a pixel of a display device according to one or more embodiments.

Referring to FIG. 4, each of the pixels SP may be connected to the first voltage line VDL, the data line DL, the initialization voltage line VIL, the gate line GL, and the second voltage line VSL.

Each of the first to third pixels SP1, SP2, and SP3 may include first to third transistors ST1, ST2, and ST3, a first capacitor C1, and a plurality of light emitting elements ED.

The first transistor ST1 may include a gate electrode, a drain electrode, and a source electrode. The gate electrode of the first transistor ST1 may be connected to a first node N1, the drain electrode thereof may be connected to the first voltage line VDL, and the source electrode thereof may be connected to a second node N2. The first transistor ST1 may control a drain-source current (or driving current) based on a data voltage applied to the gate electrode.

The light emitting elements ED may include first to fourth light emitting elements ED1, ED2, ED3, and ED4. The first to fourth light emitting elements ED1, ED2, ED3, and ED4 may be connected in series. The first to fourth light emitting elements ED1, ED2, ED3, and ED4 may receive a driving current to emit light. The light emission amount or the luminance of the light emitting element ED may be proportional to the magnitude of the driving current. The light emitting element ED may be an organic light emitting diode (OLED) having an organic light emitting layer, a quantum dot light emitting diode (LED) including a quantum dot light emitting layer, a micro LED, or an inorganic LED having an inorganic semiconductor.

The first electrode of the first light emitting element ED1 may be connected to the second node N2, and the second electrode of the first light emitting element ED1 may be connected to a third node N3. The first electrode of the first light emitting element ED1 may be connected to the source electrode of the first transistor ST1, the drain electrode of the third transistor ST3 and a second capacitor electrode of the first capacitor C1 through the second node N2. The second electrode of the first light emitting element ED1 may be connected to the first electrode of the second light emitting element ED2 through the third node N3.

The first electrode of the second light emitting element ED2 may be connected to the third node N3 and the second electrode of the second light emitting element ED2 may be connected to a fourth node N4. The first electrode of the third light emitting element ED3 may be connected to the fourth node N4 and the second electrode of the third light emitting element ED3 may be connected to a fifth node N5. The first electrode of the fourth light emitting element ED4 may be connected to the fifth node N5 and the second electrode of the fourth light emitting element ED4 may be connected to the second voltage line VSL.

The second transistor ST2 may be turned on by the gate signal of the gate line GL to electrically connect the data line DL to the first node N1 which is the gate electrode of the first transistor ST1. The second transistor ST2 may be turned on according to the gate signal to supply the data voltage to the first node N1. The gate electrode of the second transistor ST2 may be connected to the gate line GL, the drain electrode thereof may be connected to the data line DL, and the source electrode thereof may be connected to the first node N1. The source electrode of the second transistor ST2 may be connected to the gate electrode of the first transistor ST1 and a first capacitor electrode of the first capacitor C1 through the first node N1.

The third transistor ST3 may be turned on by the gate signal of the gate line GL to electrically connect the initialization voltage line VIL to the second node N2 which is the source electrode of the first transistor ST1. The third transistor ST3 may be turned on according to the gate signal to supply the initialization voltage to the second node N2. The third transistor ST3 may be turned on according to the gate signal to supply the sensing signal to the initialization voltage line VIL. The gate electrode of the third transistor ST3 may be connected to the gate line GL, the drain electrode thereof may be connected to the second node N2, and the source electrode thereof may be connected to the initialization voltage line VIL. The drain electrode of the third transistor ST3 may be connected to the source electrode of the first transistor ST1, the second capacitor electrode of the first capacitor C1 and the first electrode of the first light emitting element ED1 through the second node N2. The first capacitor C1 may be connected between the first node N1 and the second node N2.

Figure 5:
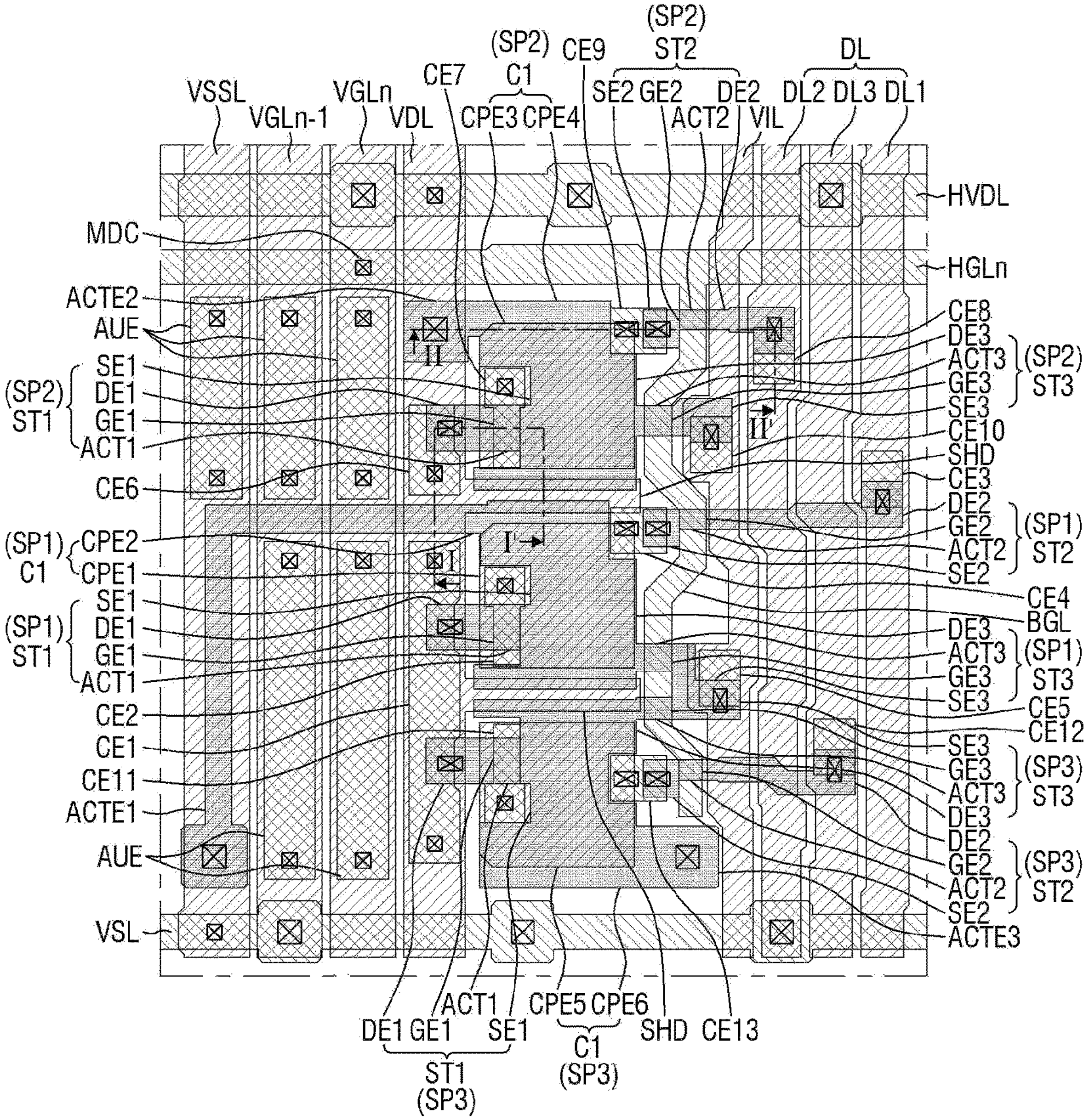
FIGS. 5 and 6 are plan views illustrating a thin film transistor layer of a display device according to one or more embodiments.
Figure 6:
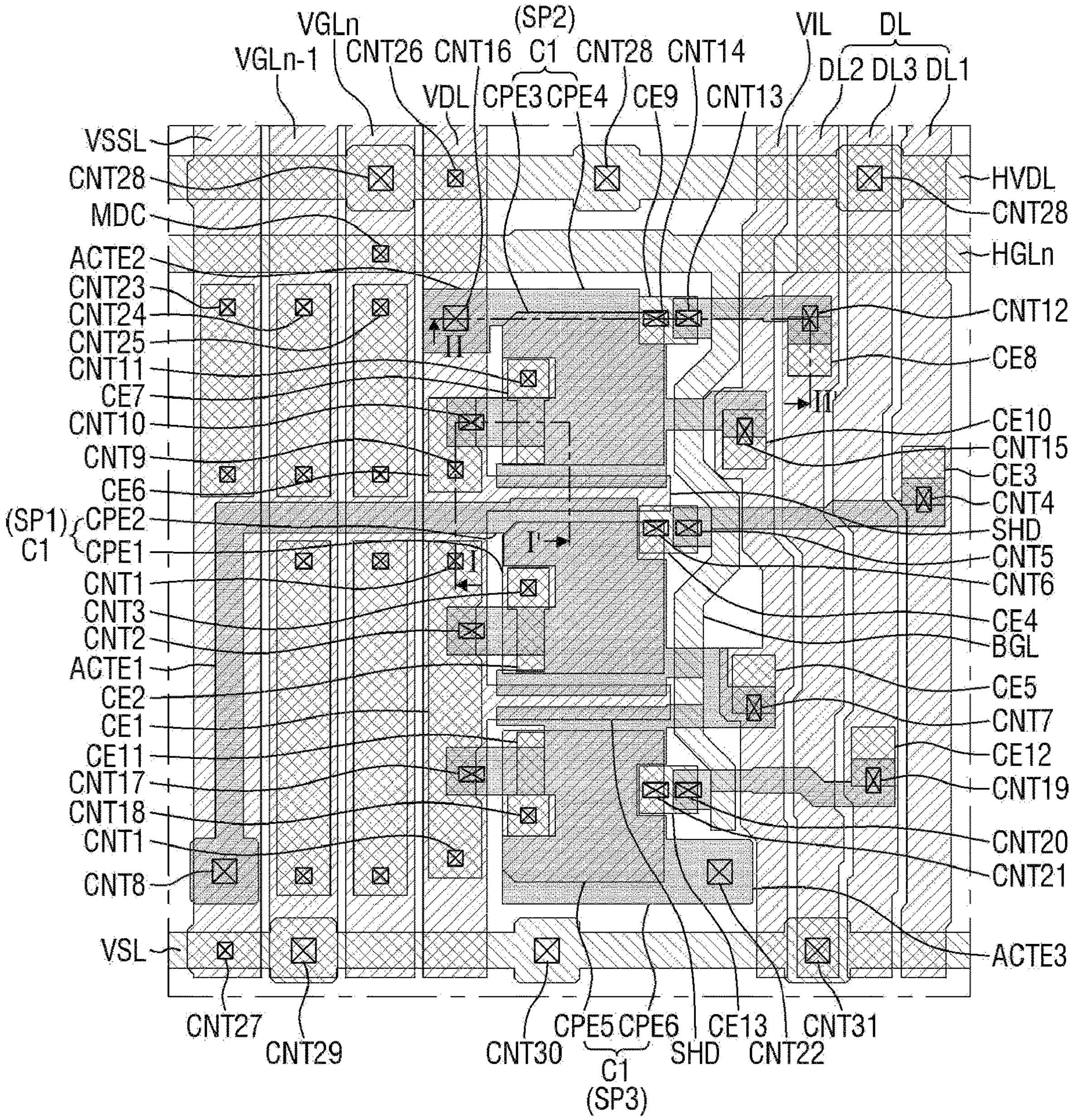
Figure 7:
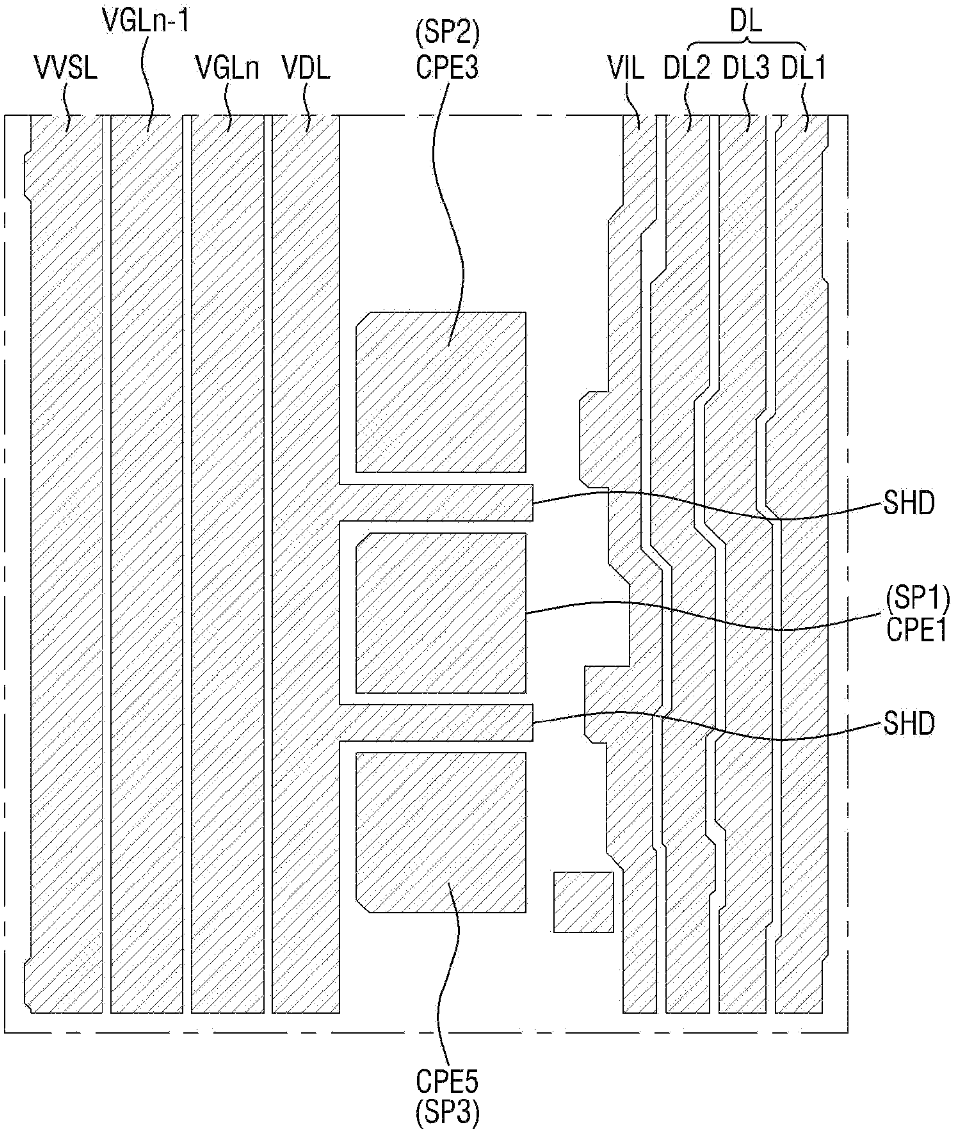
FIG. 7 is a plan view illustrating a first metal layer of a display device according to one or more embodiments.
Figure 8:
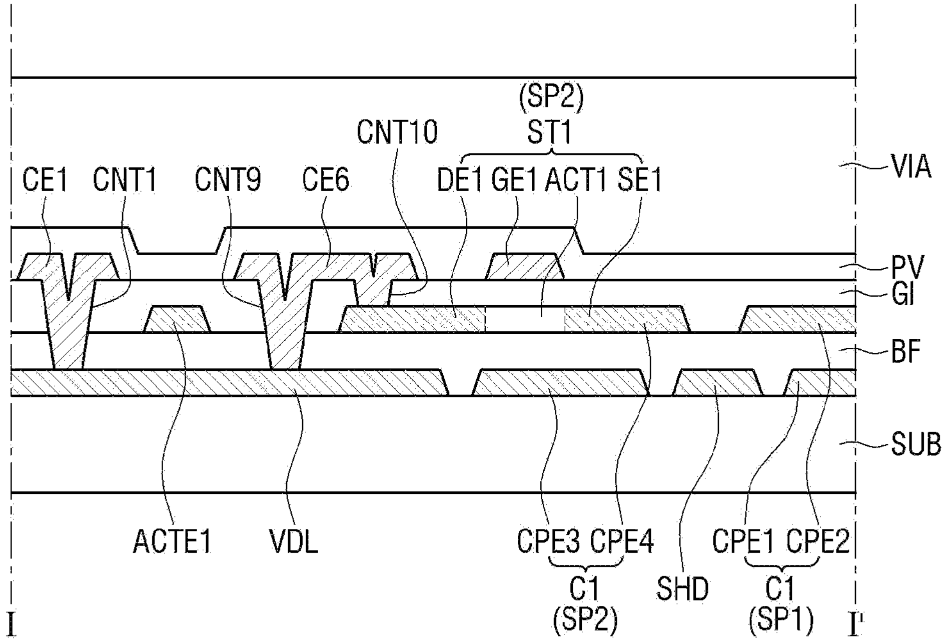
FIG. 8 is a cross-sectional view taken along the line I-I' of FIGS. 5 and 6.
Figure 9:
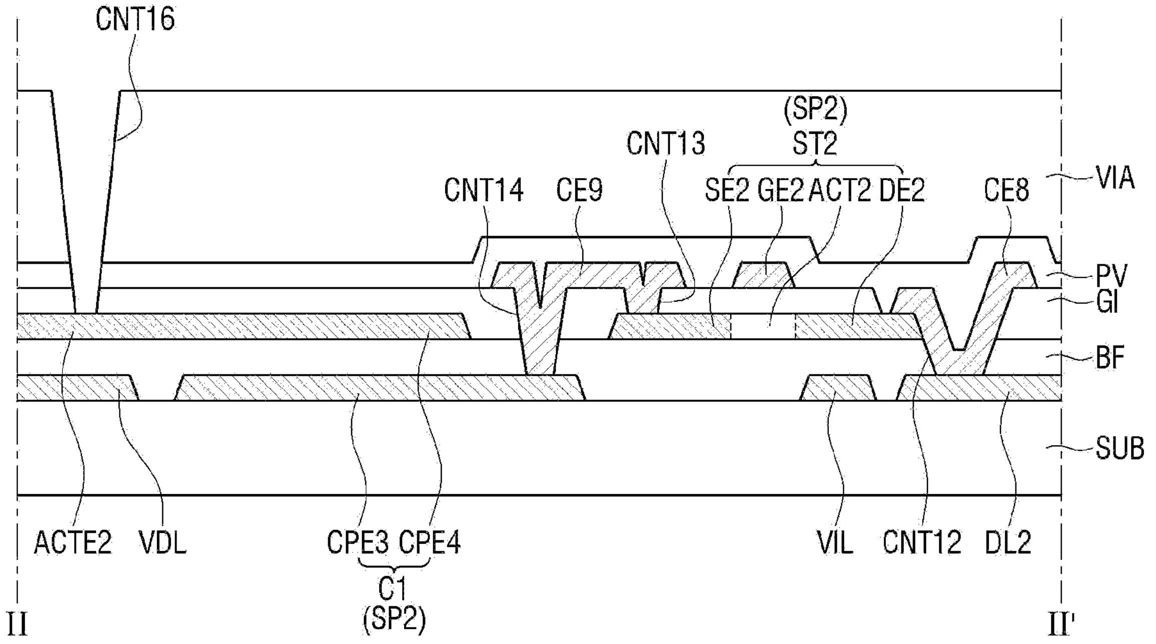
FIG. 9 is a cross-sectional view taken along the line II-II' of FIGS. 5 and 6.

FIGS. 5 and 6 are plan views illustrating a thin film transistor layer of a display device according to one or more embodiments, and FIG. 7 is a plan view illustrating a first metal layer of a display device according to one or more embodiments. FIGS. 5 and 6 illustrate the same view, in which reference numerals are distributed between them to make the drawings appear less cluttered. FIG. 8 is a cross-sectional view taken along the line I-I' of FIGS. 5 and 6, and FIG. 9 is a cross-sectional view taken along the line II-II' of FIGS. 5 and 6.

Referring to FIGS. 5 to 9, the display area DA may include the pixel SP, the first voltage line VDL, the shielding line SHD, the horizontal voltage line HVDL, the initialization voltage line VIL, the $(n-1)^{th}$ vertical gate line VGLn−1, the $n^{th}$ vertical gate line VGLn, the $n^{th}$ horizontal gate line HGLn, the auxiliary gate line BGL, the data line DL, the vertical voltage line VVSL, and the second voltage line VSL.

The pixels SP may include first to third pixels SP1, SP2, and SP3. The pixel circuits of the third pixel SP3, the first pixel SP1, and the second pixel SP2 may be arranged along the second direction (Y-axis direction), but the arrangement direction of the pixel circuits is not limited thereto.

The first voltage line VDL may be disposed in a first metal layer MTL1 on the substrate SUB. The first voltage line VDL may be disposed on the left side of the pixel circuits of the first to third pixels SP1, SP2, and SP3. The first voltage line VDL may overlap a first connection electrode CE1 and a sixth connection electrode CE6 of the second metal layer MTL2 in a thickness direction (Z-axis direction). The first voltage line VDL may be connected to the first connection electrode CE1 through a plurality of first contact holes CNT1. The first connection electrode CE1 may be connected to a drain electrode DE1 of the first transistor ST1 of the first pixel SP1 through a second contact hole CNT2, and may be connected to the drain electrode DE1 of the first transistor ST1 of the third pixel SP3 through a seventeenth contact hole CNT17. The first voltage line VDL may be connected to the sixth connection electrode CE6 through a ninth contact hole CNT9. The sixth connection electrode CE6 may be connected to the drain electrode DE1 of the first transistor ST1 of the second pixel SP2 through a tenth contact hole CNT10. Accordingly, the first voltage line VDL may supply a driving voltage to the first to third pixels SP1, SP2, and SP3 through the first and sixth connection electrodes CE1 and CE6.

The shielding line SHD may be disposed in the first metal layer MTL1. The shielding line SHD may extend from the first voltage line VDL in the first direction (X-axis direction). The shielding line SHD may be integrally formed with the first voltage line VDL, but is not limited thereto. The shielding line SHD may receive a driving voltage or a high potential voltage from the first voltage line VDL.

The shielding line SHD may be disposed between the first capacitor C1 of the second pixel SP2 and the first capacitor C1 of the first pixel SP1. The shielding line SHD may be disposed between a third capacitor electrode CPE3 of the second pixel SP2 and a first capacitor electrode CPE1 of the first pixel SP1. The shielding line SHD may overlap a region where a fourth capacitor electrode CPE4 of the second pixel SP2 and a second capacitor electrode CPE2 of the first pixel SP1 are spaced from each other. The shielding line SHD may reduce coupling capacitance between the pixel circuit of the second pixel SP2 and the pixel circuit of the first pixel SP1. The shielding line SHD may be disposed between the first capacitor C1 of the first pixel SP1 and the first capacitor C1 of the third pixel SP3. The shielding line SHD may be disposed between the first capacitor electrode CPE1 of the first pixel SP1 and a fifth capacitor electrode CPE5 of the third pixel SP3. The shielding line SHD may overlap a region where the second capacitor electrode CPE2 of the first pixel SP1 and a sixth capacitor electrode CPE6 of the third pixel SP3 are spaced from each other. The shielding line SHD may reduce coupling capacitance between the pixel circuit of the first pixel SP1 and the pixel circuit of the third pixel SP3. Accordingly, the display device 10 may reduce or minimize coupling capacitance between the first to third pixels SP1, SP2, and SP3 and improve image quality by including the shielding line SHD.

The horizontal voltage line HVDL may be disposed in the second metal layer MTL2. The second metal layer MTL2 may be disposed on a gate insulating layer GI covering an active layer ACTL. The horizontal voltage line HVDL may be disposed to the upper side of the $n^{th}$ horizontal gate line HGLn. The horizontal voltage line HVDL may be connected to the first voltage line VDL through a twenty-sixth contact hole CNT26 to receive a driving voltage. For example, the horizontal voltage line HVDL may supply a driving voltage or a high potential voltage to an alignment electrode of a third metal layer through a twenty-eighth contact hole CNT28.

The initialization voltage line VIL may be disposed in the first metal layer MTL1. The initialization voltage line VIL may be disposed on the right side of the auxiliary gate line BGL. A fifth connection electrode CE5 of the second metal layer MTL2 may electrically connect the initialization voltage line VIL to a source electrode SE3 of the third transistor ST3 of the first pixel SP1 and the source electrode SE3 of the third transistor ST3 of the third pixel SP3 through a seventh contact hole CNT7. The source electrode SE3 of the third transistor ST3 of the first pixel SP1 and the source electrode SE3 of the third transistor ST3 of the third pixel SP3 may be integrally formed, but are not limited thereto. A tenth connection electrode CE10 of the second metal layer MTL2 may electrically connect the initialization voltage line VIL to the source electrode SE3 of the third transistor ST3 of the second pixel SP2 through a fifteenth contact hole CNT15. Accordingly, the initialization voltage line VIL may supply the initialization voltage to the third transistor ST3 of each of the first to third pixels SP1, SP2, and SP3 and receive the sensing signal from the third transistor ST3.

The plurality of vertical gate lines VGL may be disposed in the first metal layer MTL1. The $(n-1)^{th}$ and $n^{th}$ vertical gate lines VGLn−1 and VGLn may be disposed on the left side of the first voltage line VDL. The $(n-1)^{th}$ vertical gate line VGLn−1 may overlap an auxiliary electrode AUE of the second metal layer MTL2 in the thickness direction (Z-axis direction), and may be connected to the auxiliary electrode AUE through the plurality of twenty-fourth contact holes CNT24. Accordingly, the $(n-1)^{th}$ vertical gate line VGLn−1 may reduce line resistance by being connected to the auxiliary electrode AUE.

The $n^{th}$ vertical gate line VGLn may be connected to the $n^{th}$ horizontal gate line HGLn of the second metal layer MTL2 through the contact portion MDC. The $n^{th}$ vertical gate line VGLn may supply a gate signal to the $n^{th}$ horizontal gate line HGLn. The $n^{th}$ vertical gate line VGLn may overlap an auxiliary electrode AUE of the second metal layer MTL2 in the thickness direction (Z-axis direction), and may be connected to the auxiliary electrode AUE through the plurality of twenty-fifth contact holes CNT25. Accordingly, the $n^{th}$ vertical gate line VGLn may reduce line resistance by being connected to the auxiliary electrode AUE.

The $n^{th}$ horizontal gate line HGLn may be disposed in the second metal layer MTL2. The $n^{th}$ horizontal gate line HGLn may be disposed on the upper side of the pixel circuit of the second pixel SP2. The $n^{th}$ horizontal gate line HGLn may be connected to the $n^{th}$ vertical gate line VGLn disposed in the first metal layer MTL1 through the contact portion MDC. The $n^{th}$ horizontal gate line HGLn may supply a gate signal received from the $n^{th}$ vertical gate line VGLn to the auxiliary gate line BGL.

The auxiliary gate line BGL may be disposed in the second metal layer MTL2. The auxiliary gate line BGL may protrude from the $n^{th}$ horizontal gate line HGLn in the opposite direction of the second direction (Y-axis direction). The auxiliary gate line BGL may be integrally formed with the $n^{th}$ horizontal gate line HGLn, but is not limited thereto. The auxiliary gate line BGL may be disposed on the right side of the pixel circuits of the first to third pixels SP1, SP2, and SP3. The auxiliary gate line BGL may supply a gate signal received from the $n^{th}$ horizontal gate line HGLn to the second and third transistors ST2 and ST3 of each of the first to third pixels SP1, SP2, and SP3.

The second data line DL2 may be disposed in the first metal layer MTL1. The second data line DL2 may be disposed on the right side of the initialization voltage line VIL. An eighth connection electrode CE8 of the second metal layer MTL2 may electrically connect the second data line DL2 to the drain electrode DE2 of the second transistor ST2 of the second pixel SP2 through a twelfth contact hole CNT12. The second data line DL2 may supply a data voltage to the second transistor ST2 of the second pixel SP2.

The third data line DL3 may be disposed in the first metal layer MTL1. The third data line DL3 may be disposed on the right side of the second data line DL2. A twelfth connection electrode CE12 of the second metal layer MTL2 may electrically connect the third data line DL3 to the drain electrode DE2 of the second transistor ST2 of the third pixel SP3 through a nineteenth contact hole CNT19. The third data line DL3 may supply a data voltage to the second transistor ST2 of the third pixel SP3.

The first data line DL1 may be disposed in the first metal layer MTL1. The first data line DL1 may be disposed on the right side of the third data line DL3. The third connection electrode CE3 of the second metal layer MTL2 may electrically connect the first data line DL1 to the drain electrode DE2 of the second transistor ST2 of the first pixel SP1 through a fourth contact hole CNT4. The first data line DL1 may supply a data voltage to the second transistor ST2 of the first pixel SP1.

The vertical voltage line VVSL may be disposed in the first metal layer MTL1. The vertical voltage line VVSL may be disposed to the left side of the $(n-1)^{th}$ vertical gate line VGLn−1. The vertical voltage line VVSL may be connected to the second voltage line VSL of the second metal layer MTL2 through a twenty-seventh contact hole CNT27. The vertical voltage line VVSL may supply a low potential voltage to the second voltage line VSL. The vertical voltage line VVSL may overlap an auxiliary electrode AUE of the second metal layer MTL2 in the thickness direction (Z-axis direction), and may be connected to the auxiliary electrode AUE through the plurality of twenty-third contact holes CNT23. Accordingly, the vertical voltage line VVSL may reduce line resistance by being connected to the auxiliary electrode AUE.

The second voltage line VSL may be disposed in the second metal layer MTL2. The second voltage line VSL may be disposed to the lower side of the pixel circuit of the third pixel SP3. The second voltage line VSL may supply the low potential voltage received from the vertical voltage line VVSL to the second electrode (e.g., the second pixel electrode) of each of the first to third pixels SP1, SP2, and SP3. For example, the second voltage line VSL may be connected to the second electrode of the first pixel SP1 through a twenty-ninth contact hole CNT29. The second voltage line VSL may be connected to the second electrode of the second pixel SP2 through a thirtieth contact hole CNT30. The second voltage line VSL may be connected to the second electrode of the third pixel SP3 through a thirty-first contact hole CNT31. For example, the second electrode of each of the first to third pixels SP1, SP2, and SP3 may be disposed in the third metal layer, and the twenty-ninth to thirty-first contact holes CNT29, CNT30, and CNT31 may be formed to penetrate a via layer VIA and a passivation layer PV. The passivation layer PV may be disposed on the second metal layer MTL2 and the gate insulating layer GI, and the via layer VIA may be disposed on the passivation layer PV.

The pixel circuit of the first pixel SP1 may include first to third transistors ST1, ST2 and ST3. The first transistor ST1 of the first pixel SP1 may include an active region ACT1, a gate electrode GE1, a drain electrode DE1, and a source electrode SE1. The active region ACT1 of the first transistor ST1 may be disposed in the active layer ACTL and may overlap the gate electrode GE1 of the first transistor ST1 in the thickness direction (Z-axis direction). The active layer ACTL may be disposed on a buffer layer BF covering the first metal layer MTL1.

The gate electrode GE1 of the first transistor ST1 may be disposed in the second metal layer MTL2. The gate electrode GE1 of the first transistor ST1 may be a part of the second connection electrode CE2. The second connection electrode CE2 may be connected to the first capacitor electrode CPE1 of the first capacitor C1 disposed in the first metal layer MTL1 through a third contact hole CNT3.

The drain electrode DE1 and the source electrode SE1 of the first transistor ST1 may be made conductive by heat treatment of the active layer ACTL. The drain electrode DE1 and the source electrode SE1 may be made conductive as an N-type semiconductor, but are not limited thereto. The first connection electrode CE1 may electrically connect the first voltage line VDL to the drain electrode DE1 of the first transistor ST1. The drain electrode DE1 of the first transistor ST1 may receive the driving voltage from the first voltage line VDL.

The source electrode SE1 of the first transistor ST1 may be integrally formed with the second capacitor electrode CPE2 of the first capacitor C1. Therefore, the display device 10 may not include a separate contact hole for connecting the source electrode SE1 of the first transistor ST1 to the second capacitor electrode CPE2 of the first capacitor C1, and may increase the capacitance of the first capacitor C1 by securing the area of the first capacitor C1.

The first capacitor C1 may be formed between the first capacitor electrode CPE1 of the first metal layer MTL1 and the second capacitor electrode CPE2 of the active layer ACTL. The second capacitor electrode CPE2 may be disposed on the first capacitor electrode CPE1 to reduce or minimize coupling capacitance between the first capacitor electrode CPE1 and the second electrode of the third metal layer and prevent horizontal crosstalk, thereby improving image quality.

The second capacitor electrode CPE2 of the first pixel SP1 may include a first active extension ACTE1 of the active layer ACTL. The first active extension ACTE1 may be integrally formed with the second capacitor electrode CPE2 of the first pixel SP1. The first active extension ACTE1 may extend leftward from the second capacitor electrode CPE2 and may be bent to extend downward. The first active extension ACTE1 may cross the first voltage line VDL and the $(n-1)^{th}$ and $n^{th}$ vertical gate lines VGLn−1 and VGLn, and may overlap the vertical voltage line VVSL. The first active extension ACTE1 may be connected to the first electrode or a first contact electrode of the first pixel SP1 through an eighth contact hole CNT8. Here, the first electrode of the first pixel SP1 may be disposed in the third metal layer, and the first contact electrode of the first pixel SP1 may be disposed in the fourth metal layer. The eighth contact hole CNT8 may be formed to penetrate the via layer VIA, the passivation layer PV, and the gate insulating layer GI.

The second transistor ST2 of the first pixel SP1 may include an active region ACT2, a gate electrode GE2, a drain electrode DE2, and a source electrode SE2. The active region ACT2 of the second transistor ST2 may be disposed in the active layer ACTL and may overlap the gate electrode GE2 of the second transistor ST2 in the thickness direction (Z-axis direction).

The gate electrode GE2 of the second transistor ST2 may be disposed in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the first data line DL1 through the third connection electrode CE3. The drain electrode DE2 of the second transistor ST2 may receive the data voltage of the first pixel SP1 from the first data line DL1.

The source electrode SE2 of the second transistor ST2 may be connected to a fourth connection electrode CE4 of the second metal layer MTL2 through a fifth contact hole CNT5. The fourth connection electrode CE4 may be connected to the first capacitor electrode CPE1 of the first metal layer MTL1 through a sixth contact hole CNT6. Accordingly, the fourth connection electrode CE4 may electrically connect the source electrode SE2 of the second transistor ST2 to the first capacitor electrode CPE1.

The third transistor ST3 of the first pixel SP1 may include an active region ACT3, a gate electrode GE3, a drain electrode DE3, and a source electrode SE3. The active region ACT3 of the third transistor ST3 may be disposed in the active layer ACTL and may overlap the gate electrode GE3 of the third transistor ST3 in the thickness direction (Z-axis direction).

The gate electrode GE3 of the third transistor ST3 may be disposed in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be integrally formed with the second capacitor electrode CPE2 of the first capacitor C1. Therefore, the display device 10 may not include a separate contact hole for connecting the drain electrode DE3 of the third transistor ST3 to the second capacitor electrode CPE2 of the first capacitor C1, and may increase the capacitance of the first capacitor C1 by securing the area of the first capacitor C1.

The source electrode SE3 of the third transistor ST3 may be connected to the fifth connection electrode CE5 of the second metal layer MTL2 through the seventh contact hole CNT7. The fifth connection electrode CE5 may electrically connect the source electrode SE3 of the third transistor ST3 to the initialization voltage line VIL through the seventh contact hole CNT7. The source electrode SE3 of the third transistor ST3 may receive the initialization voltage from the initialization voltage line VIL. The source electrode SE3 of the third transistor ST3 may supply the sensing signal to the initialization voltage line VIL.

The pixel circuit of the second pixel SP2 may include first to third transistors ST1, ST2, and ST3. The first transistor ST1 of the second pixel SP2 may include an active region ACT1, a gate electrode GE1, a drain electrode DE1, and a source electrode SE1. The active region ACT1 of the first transistor ST1 may be disposed in the active layer ACTL and may overlap the gate electrode GE1 of the first transistor ST1 in the thickness direction (Z-axis direction).

The gate electrode GE1 of the first transistor ST1 may be disposed in the second metal layer MTL2. The gate electrode GE1 of the first transistor ST1 may be a part of the seventh connection electrode CE7. The seventh connection electrode CE7 may be connected to the third capacitor electrode CPE3 of the first capacitor C1 disposed in the first metal layer MTL1 through an eleventh contact hole CNT11.

The drain electrode DE1 and the source electrode SE1 of the first transistor ST1 may be made conductive by heat treatment of the active layer ACTL. The drain electrode DE1 and the source electrode SE1 may be made conductive as an N-type semiconductor, but are not limited thereto. The sixth connection electrode CE6 may electrically connect the first voltage line VDL to the drain electrode DE1 of the first transistor ST1. The drain electrode DE1 of the first transistor ST1 may receive the driving voltage from the first voltage line VDL.

The source electrode SE1 of the first transistor ST1 may be integrally formed with the fourth capacitor electrode CPE4 of the first capacitor C1. Therefore, the display device 10 may not include a separate contact hole for connecting the source electrode SE1 of the first transistor ST1 to the fourth capacitor electrode CPE4 of the first capacitor C1, and may increase the capacitance of the first capacitor C1 by securing the area of the first capacitor C1.

The first capacitor C1 may be formed between the third capacitor electrode CPE3 of the first metal layer MTL1 and the fourth capacitor electrode CPE4 of the active layer ACTL. The fourth capacitor electrode CPE4 may be disposed on the third capacitor electrode CPE3 to reduce or minimize coupling capacitance between the third capacitor electrode CPE3 and the second electrode of the third metal layer and prevent horizontal crosstalk, thereby improving image quality.

The fourth capacitor electrode CPE4 of the second pixel SP2 may include a second active extension ACTE2 of the active layer ACTL. The second active extension ACTE2 may be integrally formed with the fourth capacitor electrode CPE4 of the second pixel SP2. The second active extension ACTE2 may extend leftward from the fourth capacitor electrode CPE4. The second active extension ACTE2 may be connected to the first electrode or the first contact electrode of the second pixel SP2 through a sixteenth contact hole CNT16. Here, the first electrode of the second pixel SP2 may be disposed in the third metal layer, and the first contact electrode of the second pixel SP2 may be disposed in the fourth metal layer. The sixteenth contact hole CNT16 may be formed to penetrate the via layer VIA, the passivation layer PV, and the gate insulating layer GI.

The second transistor ST2 of the second pixel SP2 may include an active region ACT2, a gate electrode GE2, a drain electrode DE2, and a source electrode SE2. The active region ACT2 of the second transistor ST2 may be disposed in the active layer ACTL and may overlap the gate electrode GE2 of the second transistor ST2 in the thickness direction (Z-axis direction).

The gate electrode GE2 of the second transistor ST2 may be disposed in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the second data line DL2 through the eighth connection electrode CE8. The drain electrode DE2 of the second transistor ST2 may receive the data voltage of the second pixel SP2 from the second data line DL2.

The source electrode SE2 of the second transistor ST2 may be connected to a ninth connection electrode CE9 of the second metal layer MTL2 through a thirteenth contact hole CNT13. The ninth connection electrode CE9 may be connected to the third capacitor electrode CPE3 of the first metal layer MTL1 through a twelfth contact hole CNT12. Accordingly, the ninth connection electrode CE9 may electrically connect the source electrode SE2 of the second transistor ST2 to the third capacitor electrode CPE3.

The third transistor ST3 of the second pixel SP2 may include an active region ACT3, a gate electrode GE3, a drain electrode DE3, and a source electrode SE3. The active region ACT3 of the third transistor ST3 may be disposed in the active layer ACTL and may overlap the gate electrode GE3 of the third transistor ST3 in the thickness direction (Z-axis direction).

The gate electrode GE3 of the third transistor ST3 may be disposed in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be integrally formed with the fourth capacitor electrode CPE4 of the first capacitor C1. Therefore, the display device 10 may not include a separate contact hole for connecting the drain electrode DE3 of the third transistor ST3 to the fourth capacitor electrode CPE4 of the first capacitor C1, and may increase the capacitance of the first capacitor C1 by securing the area of the first capacitor C1.

The source electrode SE3 of the third transistor ST3 may be connected to a tenth connection electrode CE10 of the second metal layer MTL2 through the fifteenth contact hole CNT15. The tenth connection electrode CE10 may electrically connect the source electrode SE3 of the third transistor ST3 to the initialization voltage line VIL through the fifteenth contact hole CNT15. The source electrode SE3 of the third transistor ST3 may receive the initialization voltage from the initialization voltage line VIL. The source electrode SE3 of the third transistor ST3 may supply the sensing signal to the initialization voltage line VIL.

The pixel circuit of the third pixel SP3 may include first to third transistors ST1, ST2, and ST3. The first transistor ST1 of the third pixel SP3 may include an active region ACT1, a gate electrode GE1, a drain electrode DE1, and a source electrode SE1. The active region ACT1 of the first transistor ST1 may be disposed in the active layer ACTL and may overlap the gate electrode GE1 of the first transistor ST1 in the thickness direction (Z-axis direction).

The gate electrode GE1 of the first transistor ST1 may be disposed in the second metal layer MTL2. The gate electrode GE1 of the first transistor ST1 may be a part of an eleventh connection electrode CE11. The eleventh connection electrode CE11 may be connected to the fifth capacitor electrode CPE5 of the first capacitor C1 disposed in the first metal layer MTL1 through an eighteenth contact hole CNT18.

The drain electrode DE1 and the source electrode SE1 of the first transistor ST1 may be made conductive by heat treatment of the active layer ACTL. The drain electrode DE1 and the source electrode SE1 may be made conductive as an N-type semiconductor, but are not limited thereto. The first connection electrode CE1 may electrically connect the first voltage line VDL to the drain electrode DE1 of the first transistor ST1. The drain electrode DE1 of the first transistor ST1 may receive the driving voltage from the first voltage line VDL.

The source electrode SE1 of the first transistor ST1 may be integrally formed with the sixth capacitor electrode CPE6 of the first capacitor C1. Therefore, the display device 10 may not include a separate contact hole for connecting the source electrode SE1 of the first transistor ST1 to the sixth capacitor electrode CPE6 of the first capacitor C1, and may increase the capacitance of the first capacitor C1 by securing the area of the first capacitor C1.

The first capacitor C1 may be formed between the fifth capacitor electrode CPE5 of the first metal layer MTL1 and the sixth capacitor electrode CPE6 of the active layer ACTL. The sixth capacitor electrode CPE6 may be disposed on the fifth capacitor electrode CPE5 to reduce or minimize coupling capacitance between the fifth capacitor electrode CPE5 and the second electrode of the third metal layer and prevent horizontal crosstalk, thereby improving image quality.

The sixth capacitor electrode CPE6 of the third pixel SP3 may include a third active extension ACTE3 of the active layer ACTL. The third active extension ACTE3 may be integrally formed with the sixth capacitor electrode CPE6 of the third pixel SP3. The third active extension ACTE3 may extend rightward from the sixth capacitor electrode CPE6. The third active extension ACTE3 may be connected to the first electrode or the first contact electrode of the third pixel SP3 through a twenty-second contact hole CNT22. Here, the first electrode of the third pixel SP3 may be disposed in the third metal layer, and the first contact electrode of the third pixel SP3 may be disposed in the fourth metal layer. The twenty-second contact hole CNT22 may be formed to penetrate the via layer VIA, the passivation layer PV, and the gate insulating layer GI.

The second transistor ST2 of the third pixel SP3 may include an active region ACT2, a gate electrode GE2, a drain electrode DE2, and a source electrode SE2. The active region ACT2 of the second transistor ST2 may be disposed in the active layer ACTL and may overlap the gate electrode GE2 of the second transistor ST2 in the thickness direction (Z-axis direction).

The gate electrode GE2 of the second transistor ST2 may be disposed in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the third data line DL3 through the twelfth connection electrode CE12. The drain electrode DE2 of the second transistor ST2 may receive the data voltage of the third pixel SP3 from the third data line DL3.

The source electrode SE2 of the second transistor ST2 may be connected to a thirteenth connection electrode CE13 of the second metal layer MTL2 through a twentieth contact hole CNT20. The thirteenth connection electrode CE13 may be connected to the fifth capacitor electrode CPE5 of the first metal layer MTL1 through a twenty-first contact hole CNT21. Accordingly, the thirteenth connection electrode CE13 may electrically connect the source electrode SE2 of the second transistor ST2 to the fifth capacitor electrode CPE5.

The third transistor ST3 of the third pixel SP3 may include an active region ACT3, a gate electrode GE3, a drain electrode DE3, and a source electrode SE3. The active region ACT3 of the third transistor ST3 may be disposed in the active layer ACTL and may overlap the gate electrode GE3 of the third transistor ST3 in the thickness direction (Z-axis direction).

The gate electrode GE3 of the third transistor ST3 may be disposed in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be integrally formed with the sixth capacitor electrode CPE6 of the first capacitor C1. Therefore, the display device 10 may not include a separate contact hole for connecting the drain electrode DE3 of the third transistor ST3 to the sixth capacitor electrode CPE6 of the first capacitor C1, and may increase the capacitance of the first capacitor C1 by securing the area of the first capacitor C1.

The source electrode SE3 of the third transistor ST3 may be connected to the fifth connection electrode CE5 of the second metal layer MTL2 through the seventh contact hole CNT7. The fifth connection electrode CE5 may electrically connect the source electrode SE3 of the third transistor ST3 to the initialization voltage line VIL through the seventh contact hole CNT7. The source electrode SE3 of the third transistor ST3 may receive the initialization voltage from the initialization voltage line VIL. The source electrode SE3 of the third transistor ST3 may supply the sensing signal to the initialization voltage line VIL.

Figure 10:
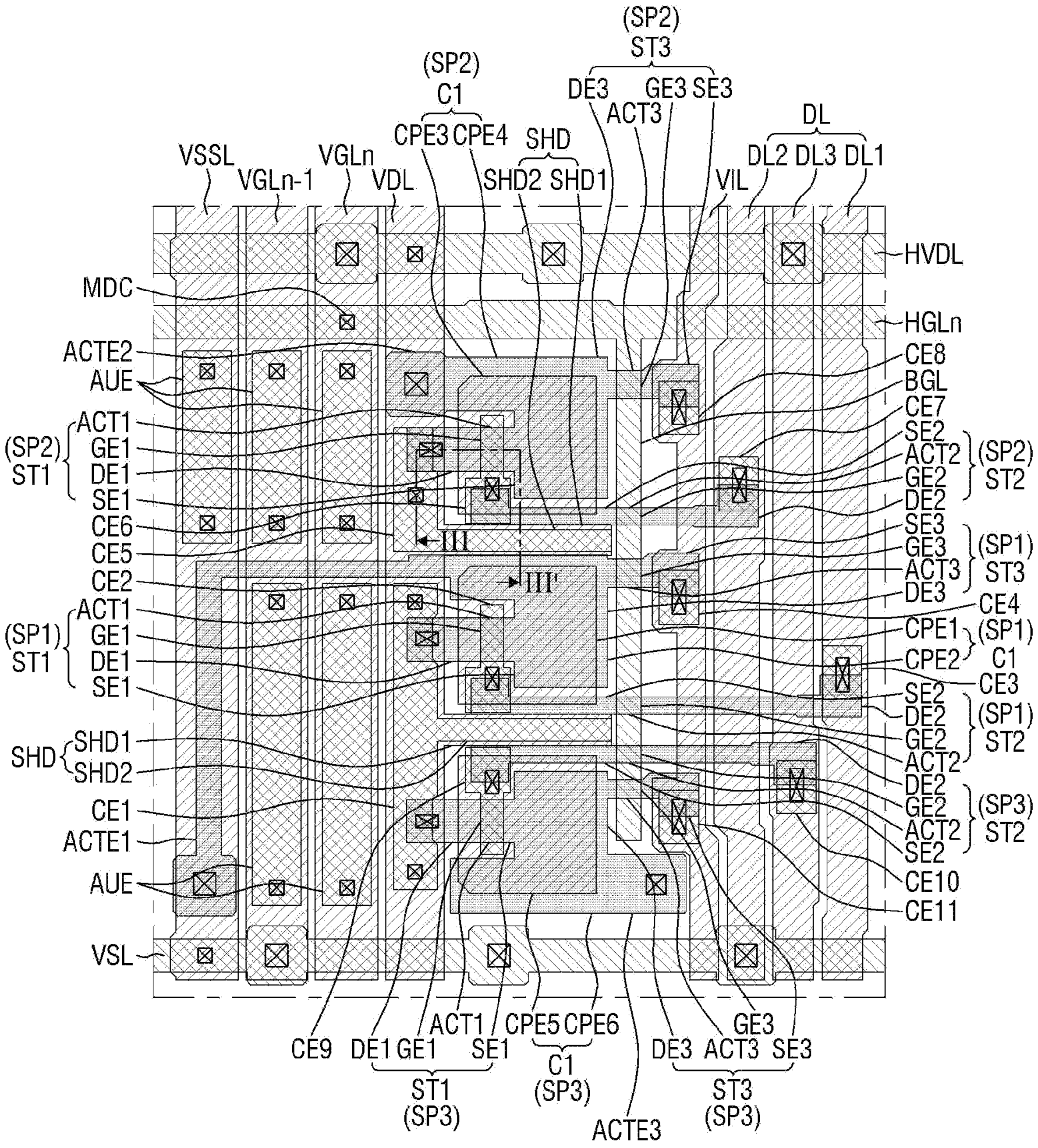
FIGS. 10 and 11 are plan views illustrating a thin film transistor layer of a display device according to one or more embodiments.
Figure 11:
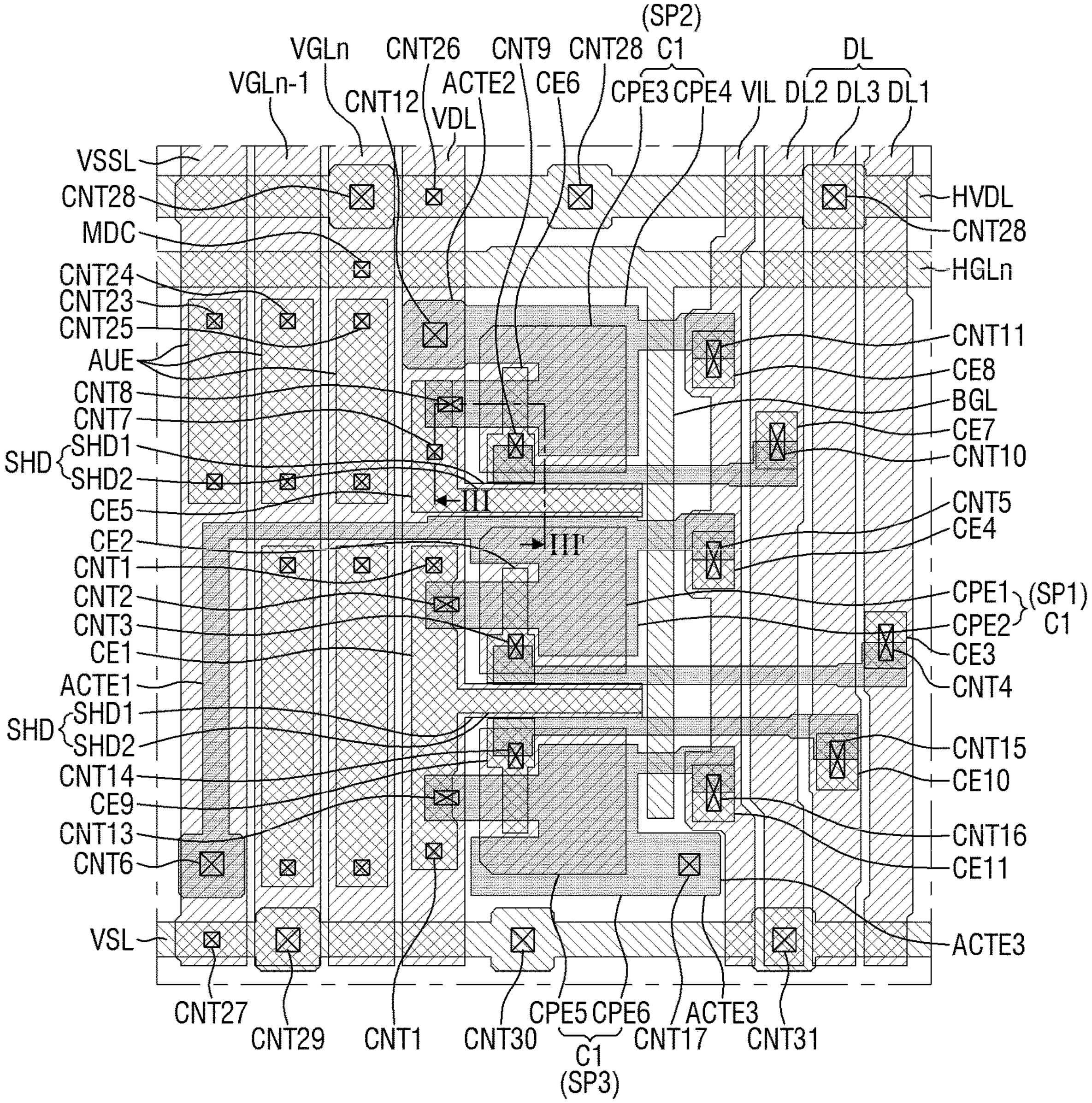
Figure 12:
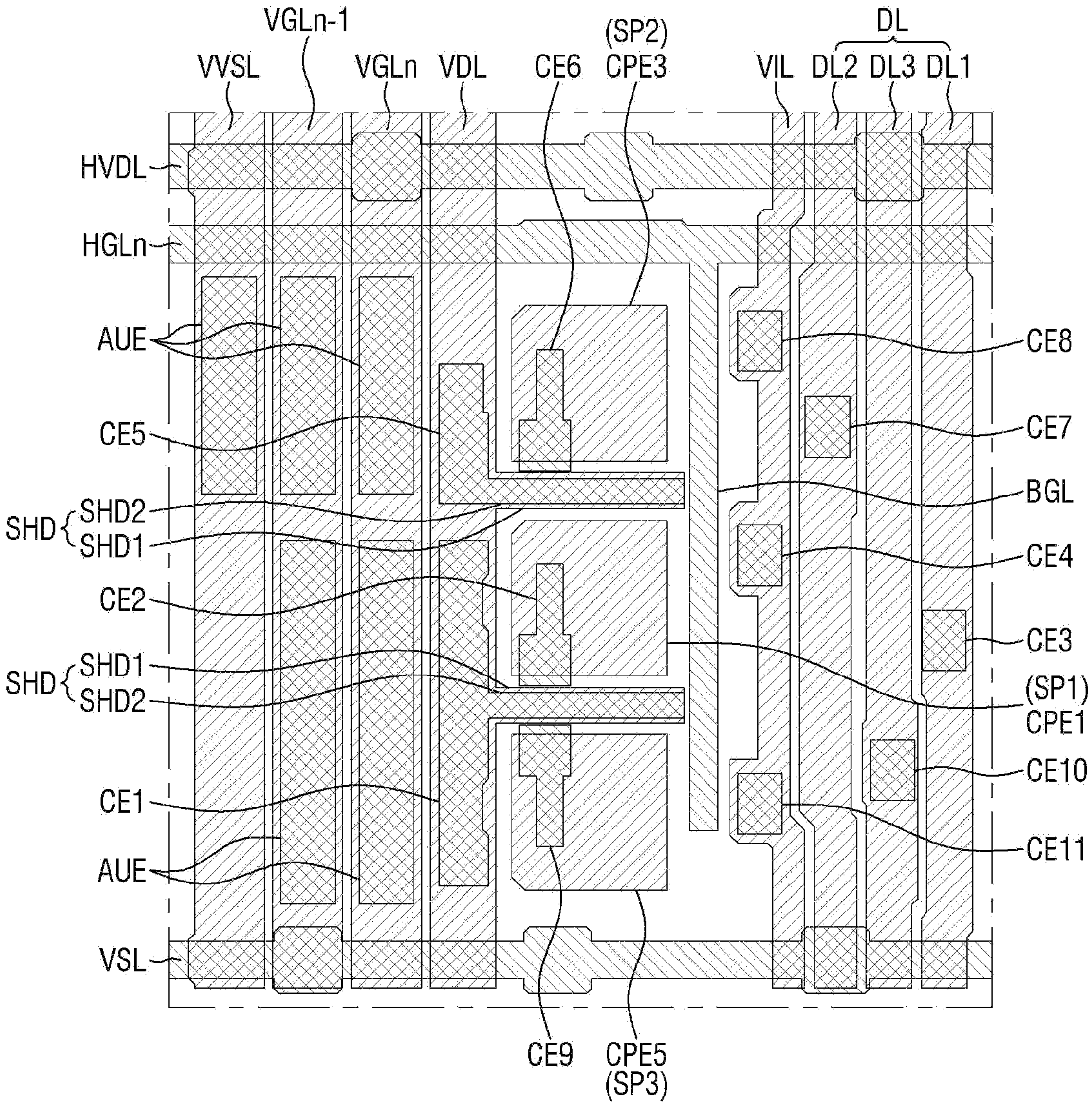
FIG. 12 is a plan view illustrating a first metal layer and a second metal layer of a display device according to one or more embodiments.
Figure 13:
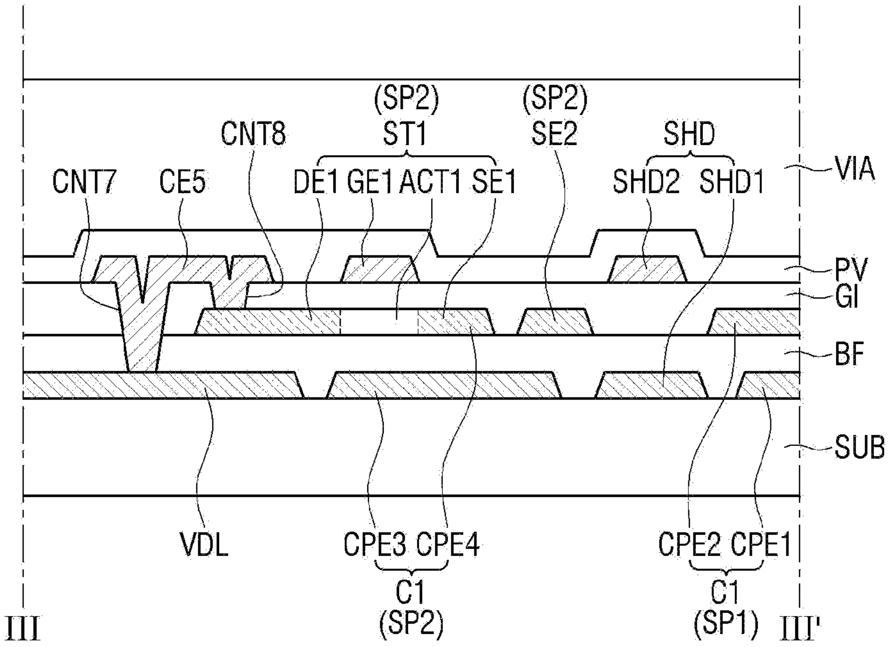
FIG. 13 is a cross-sectional view taken along the line III-III' of FIGS. 10 and 11.

FIGS. 10 and 11 are plan views illustrating a thin film transistor layer of a display device according to one or more embodiments. FIGS. 10 and 11 illustrate the same view, in which reference numerals are distributed between them to make the drawings appear less cluttered. FIG. 12 is a plan view illustrating a first metal layer and a second metal layer of a display device according to one or more embodiments, and FIG. 13 is a cross-sectional view taken along the line III-III' of FIGS. 10 and 11.

Referring to FIGS. 10 to 13, the display area DA may include the pixel SP, the first voltage line VDL, the shielding line SHD, the horizontal voltage line HVDL, the initialization voltage line VIL, the $(n-1)^{th}$ vertical gate line VGLn−1, the $n^{th}$ vertical gate line VGLn, the $n^{th}$ horizontal gate line HGLn, the auxiliary gate line BGL, the data line DL, the vertical voltage line VVSL, and the second voltage line VSL.

The pixels SP may include first to third pixels SP1, SP2, and SP3. The pixel circuits of the third pixel SP3, the first pixel SP1, and the second pixel SP2 may be arranged along the second direction (Y-axis direction), but the arrangement direction of the pixel circuits is not limited thereto.

The first voltage line VDL may be disposed in a first metal layer MTL1 on the substrate SUB. The first voltage line VDL may be disposed on the left side of the pixel circuits of the first to third pixels SP1, SP2, and SP3. The first voltage line VDL may overlap the first connection electrode CE1 and the fifth connection electrode CE5 of the second metal layer MTL2 in a thickness direction (Z-axis direction). The first voltage line VDL may be connected to the first connection electrode CE1 through a plurality of first contact holes CNT1. The first connection electrode CE1 may be connected to the drain electrode DE1 of the first transistor ST1 of the first pixel SP1 through a second contact hole CNT2, and may be connected to the drain electrode DE1 of the first transistor ST1 of the third pixel SP3 through a thirteenth contact hole CNT13. The first voltage line VDL may be connected to the fifth connection electrode CE5 through a seventh contact hole CNT7. The fifth connection electrode CE5 may be connected to the drain electrode DE1 of the first transistor ST1 of the second pixel SP2 through an eighth contact hole CNT8. Accordingly, the first voltage line VDL may supply a driving voltage to the first to third pixels SP1, SP2, and SP3 through the first and fifth connection electrodes CE1 and CE5.

The shielding line SHD may include first and second shielding lines SHD1 and SHD2.

The first shielding line SHD1 may be disposed in the first metal layer MTL1. The first shielding line SHD1 may extend from the first voltage line VDL in the first direction (X-axis direction). The first shielding line SHD1 may be integrally formed with the first voltage line VDL, but is not limited thereto. The first shielding line SHD1 may receive a driving voltage or a high potential voltage from the first voltage line VDL.

The first shielding line SHD1 may be disposed between the first capacitor C1 of the second pixel SP2 and the first capacitor C1 of the first pixel SP1. The first shielding line SHD1 may be disposed between the third capacitor electrode CPE3 of the first capacitor C1 of the second pixel SP2 and the first capacitor electrode CPE1 of the first capacitor C1 of the first pixel SP1. The first shielding line SHD1 may reduce coupling capacitance between the pixel circuit of the second pixel SP2 and the pixel circuit of the first pixel SP1.

The first shielding line SHD1 may be disposed between the first capacitor C1 of the first pixel SP1 and the first capacitor C1 of the third pixel SP3. The first shielding line SHD1 may be disposed between the first capacitor electrode CPE1 of the first capacitor C1 of the first pixel SP1 and the fifth capacitor electrode CPE5 of the first capacitor C1 of the third pixel SP3. The first shielding line SHD1 may reduce coupling capacitance between the pixel circuit of the first pixel SP1 and the pixel circuit of the third pixel SP3.

The second shielding line SHD2 may be disposed in the second metal layer MTL2. The second shielding line SHD2 may overlap the first shielding line SHD1 in the third direction (Z-axis direction). The second shielding line SHD2 may extend in the first direction (X-axis direction) from the first or fifth connection electrode CE1 or CE5. The second shielding line SHD2 may be integrally formed with the first or fifth connection electrode CE1 or CE5, but is not limited thereto. The second shielding line SHD2 may receive a driving voltage or a high potential voltage from the first or fifth connection electrode CE1 or CE5.

The second shielding line SHD2 may be disposed between the first capacitor C1 of the second pixel SP2 and the first capacitor C1 of the first pixel SP1. The second shielding line SHD2 may be disposed between the fourth capacitor electrode CPE4 of the first capacitor C1 of the second pixel SP2 and the second capacitor electrode CPE2 of the first capacitor C1 of the first pixel SP1. The second shielding line SHD2 may be disposed between the source electrode SE2 of the second transistor ST2 of the second pixel SP2 and the second capacitor electrode CPE2 of the first pixel SP1. The second shielding line SHD2 may reduce coupling capacitance between the pixel circuit of the second pixel SP2 and the pixel circuit of the first pixel SP1.

The second shielding line SHD2 may be disposed between the first capacitor C1 of the first pixel SP1 and the first capacitor C1 of the third pixel SP3. The second shielding line SHD2 may be disposed between the second capacitor electrode CPE2 of the first capacitor C1 of the first pixel SP1 and the sixth capacitor electrode CPE6 of the first capacitor C1 of the third pixel SP3. The second shielding line SHD2 may be disposed between the source electrode SE2 of the second transistor ST2 of the first pixel SP1 and the source electrode SE2 of the second transistor ST2 of the third pixel SP3. The second shielding line SHD2 may reduce coupling capacitance between the pixel circuit of the first pixel SP1 and the pixel circuit of the third pixel SP3.

Accordingly, the display device 10 may reduce or minimize coupling capacitance between the first to third pixels SP1, SP2, and SP3 and improve image quality, by including the first and second shielding lines SHD1 and SHD2.

The horizontal voltage line HVDL may be disposed in the second metal layer MTL2. The second metal layer MTL2 may be disposed on a gate insulating layer GI covering an active layer ACTL. The horizontal voltage line HVDL may be disposed to the upper side of the $n^{th}$ horizontal gate line HGLn. The horizontal voltage line HVDL may be connected to the first voltage line VDL through a twenty-sixth contact hole CNT26 to receive a driving voltage. For example, the horizontal voltage line HVDL may supply a driving voltage or a high potential voltage to the alignment electrode of the third metal layer through a twenty-eighth contact hole CNT28.

The initialization voltage line VIL may be disposed in the first metal layer MTL1. The initialization voltage line VIL may be disposed on the right side of the auxiliary gate line BGL. The fourth connection electrode CE4 of the second metal layer MTL2 may electrically connect the initialization voltage line VIL to a source electrode SE3 of the third transistor ST3 of the first pixel SP1 through a fifth contact hole CNT5. The eighth connection electrode CE8 of the second metal layer MTL2 may electrically connect the initialization voltage line VIL to the source electrode SE3 of the third transistor ST3 of the second pixel SP2 through the eleventh contact hole CNT11. The eleventh connection electrode CE11 of the second metal layer MTL2 may electrically connect the initialization voltage line VIL to the source electrode SE3 of the third transistor ST3 of the second pixel SP2 through the sixteenth contact hole CNT16. Accordingly, the initialization voltage line VIL may supply the initialization voltage to the third transistor ST3 of each of the first to third pixels SP1, SP2, and SP3 and receive the sensing signal from the third transistor ST3.

The plurality of vertical gate lines VGL may be disposed in the first metal layer MTL1. The $(n-1)^{th}$ and $n^{th}$ vertical gate lines VGLn−1 and VGLn may be disposed on the left side of the first voltage line VDL. The $(n-1)^{th}$ vertical gate line VGLn−1 may overlap an auxiliary electrode AUE of the second metal layer MTL2 in the thickness direction (Z-axis direction), and may be connected to the auxiliary electrode AUE through the plurality of twenty-fourth contact holes CNT24. Accordingly, the $(n-1)^{th}$ vertical gate line VGLn−1 may reduce line resistance by being connected to the auxiliary electrode AUE.

The $n^{th}$ vertical gate line VGLn may be connected to the $n^{th}$ horizontal gate line HGLn of the second metal layer MTL2 through the contact portion MDC. The $n^{th}$ vertical gate line VGLn may supply a gate signal to the $n^{th}$ horizontal gate line HGLn. The $n^{th}$ vertical gate line VGLn may overlap an auxiliary electrode AUE of the second metal layer MTL2 in the thickness direction (Z-axis direction), and may be connected to the auxiliary electrode AUE through the plurality of twenty-fifth contact holes CNT25. Accordingly, the $n^{th}$ vertical gate line VGLn may reduce line resistance by being connected to the auxiliary electrode AUE.

The $n^{th}$ horizontal gate line HGLn may be disposed in the second metal layer MTL2. The $n^{th}$ horizontal gate line HGLn may be disposed on the upper side of the pixel circuit of the second pixel SP2. The $n^{th}$ horizontal gate line HGLn may be connected to the $n^{th}$ vertical gate line VGLn disposed on the first metal layer MTL1 through the contact portion MDC. The $n^{th}$ horizontal gate line HGLn may supply a gate signal received from the $n^{th}$ vertical gate line VGLn to the auxiliary gate line BGL.

The auxiliary gate line BGL may be disposed in the second metal layer MTL2. The auxiliary gate line BGL may protrude from the $n^{th}$ horizontal gate line HGLn in the opposite direction of the second direction (Y-axis direction). The auxiliary gate line BGL may be integrally formed with the $n^{th}$ horizontal gate line HGLn, but is not limited thereto. The auxiliary gate line BGL may be disposed on the right side of the pixel circuits of the first to third pixels SP1, SP2, and SP3. The auxiliary gate line BGL may supply a gate signal received from the $n^{th}$ horizontal gate line HGLn to the second and third transistors ST2 and ST3 of each of the first to third pixels SP1, SP2, and SP3.

The second data line DL2 may be disposed in the first metal layer MTL1. The second data line DL2 may be disposed on the right side of the initialization voltage line VIL. The seventh connection electrode CE7 of the second metal layer MTL2 may electrically connect the second data line DL2 to the drain electrode DE2 of the second transistor ST2 of the second pixel SP2 through the tenth contact hole CNT10. The second data line DL2 may supply a data voltage to the second transistor ST2 of the second pixel SP2.

The third data line DL3 may be disposed in the first metal layer MTL1. The third data line DL3 may be disposed on the right side of the second data line DL2. The tenth connection electrode CE10 of the second metal layer MTL2 may electrically connect the third data line DL3 to the drain electrode DE2 of the second transistor ST2 of the third pixel SP3 through the fifteenth contact hole CNT15. The third data line DL3 may supply a data voltage to the second transistor ST2 of the third pixel SP3.

The first data line DL1 may be disposed in the first metal layer MTL1. The first data line DL1 may be disposed on the right side of the third data line DL3. The third connection electrode CE3 of the second metal layer MTL2 may electrically connect the first data line DL1 to the drain electrode DE2 of the second transistor ST2 of the first pixel SP1 through a fourth contact hole CNT4. The first data line DL1 may supply a data voltage to the second transistor ST2 of the first pixel SP1.

The vertical voltage line VVSL may be disposed in the first metal layer MTL1. The vertical voltage line VVSL may be disposed to the left side of the $(n-1)^{th}$ vertical gate line VGLn−1. The vertical voltage line VVSL may be connected to the second voltage line VSL of the second metal layer MTL2 through a twenty-seventh contact hole CNT27. The vertical voltage line VVSL may supply a low potential voltage to the second voltage line VSL. The vertical voltage line VVSL may overlap an auxiliary electrode AUE of the second metal layer MTL2 in the thickness direction (Z-axis direction), and may be connected to the auxiliary electrode AUE through the plurality of twenty-third contact holes CNT23. Accordingly, the vertical voltage line VVSL may reduce line resistance by being connected to the auxiliary electrode AUE.

The second voltage line VSL may be disposed in the second metal layer MTL2. The second voltage line VSL may be disposed to the lower side of the pixel circuit of the third pixel SP3. The second voltage line VSL may supply the low potential voltage received from the vertical voltage line VVSL to the second electrode of each of the first to third pixels SP1, SP2, and SP3. For example, the second voltage line VSL may be connected to the second electrode of the first pixel SP1 through a twenty-ninth contact hole CNT29. The second voltage line VSL may be connected to the second electrode of the second pixel SP2 through a thirtieth contact hole CNT30. The second voltage line VSL may be connected to the second electrode of the third pixel SP3 through a thirty-first contact hole CNT31. For example, the second electrode of each of the first to third pixels SP1, SP2, and SP3 may be disposed in the third metal layer, and the twenty-ninth to thirty-first contact holes CNT29, CNT30, and CNT31 may be formed to penetrate the via layer VIA and the passivation layer PV. The passivation layer PV may be disposed on the second metal layer MTL2 and the gate insulating layer GI, and the via layer VIA may be disposed on the passivation layer PV.

The pixel circuit of the first pixel SP1 may include first to third transistors ST1, ST2, and ST3. The first transistor ST1 of the first pixel SP1 may include an active region ACT1, a gate electrode GE1, a drain electrode DE1, and a source electrode SE1. The active region ACT1 of the first transistor ST1 may be disposed in the active layer ACTL and may overlap the gate electrode GE1 of the first transistor ST1 in the thickness direction (Z-axis direction). The active layer ACTL may be disposed on a buffer layer BF covering the first metal layer MTL1.

The gate electrode GE1 of the first transistor ST1 may be disposed in the second metal layer MTL2. The gate electrode GE1 of the first transistor ST1 may be a part of the second connection electrode CE2. The second connection electrode CE2 may be connected to the first capacitor electrode CPE1 of the first capacitor C1 disposed in the first metal layer MTL1 through a third contact hole CNT3.

The drain electrode DE1 and the source electrode SE1 of the first transistor ST1 may be made conductive by heat treatment of the active layer ACTL. The drain electrode DE1 and the source electrode SE1 may be made conductive as an N-type semiconductor, but are not limited thereto. The first connection electrode CE1 may electrically connect the first voltage line VDL to the drain electrode DE1 of the first transistor ST1. The drain electrode DE1 of the first transistor ST1 may receive the driving voltage from the first voltage line VDL.

The source electrode SE1 of the first transistor ST1 may be integrally formed with the second capacitor electrode CPE2 of the first capacitor C1. Therefore, the display device 10 may not include a separate contact hole for connecting the source electrode SE1 of the first transistor ST1 to the second capacitor electrode CPE2 of the first capacitor C1, and may increase the capacitance of the first capacitor C1 by securing the area of the first capacitor C1.

The first capacitor C1 may be formed between the first capacitor electrode CPE1 of the first metal layer MTL1 and the second capacitor electrode CPE2 of the active layer ACTL. The second capacitor electrode CPE2 may be disposed on the first capacitor electrode CPE1 to reduce or minimize coupling capacitance between the first capacitor electrode CPE1 and the second electrode of the third metal layer and prevent horizontal crosstalk, thereby improving image quality.

The second capacitor electrode CPE2 of the first pixel SP1 may include a first active extension ACTE1 of the active layer ACTL. The first active extension ACTE1 may be integrally formed with the second capacitor electrode CPE2 of the first pixel SP1. The first active extension ACTE1 may extend leftward from the second capacitor electrode CPE2 and may be bent to extend downward. The first active extension ACTE1 may cross the first voltage line VDL and the $(n-1)^{th}$ and $n^{th}$ vertical gate lines VGLn−1 and VGLn, and may overlap the vertical voltage line VVSL. The first active extension ACTE1 may be connected to the first electrode or the first contact electrode of the first pixel SP1 through a sixth contact hole CNT6. Here, the first electrode of the first pixel SP1 may be disposed in the third metal layer, and the first contact electrode of the first pixel SP1 may be disposed in the fourth metal layer. In FIG. 13, the eighth contact hole CNT8 may be formed to penetrate the gate insulating layer GI. However, in one or more embodiments, the eighth contact hole CNT8 may be formed to penetrate the via layer VIA, the passivation layer PV, and the gate insulating layer GI. In one or more embodiments, the sixth contact hole CNT6, which connects the first active extension ACTE1 to the first electrode or the first contact electrode of the first pixel SP1, may be formed to penetrate the via layer VIA, the passivation layer PV, and the gate insulating layer GI.

The second transistor ST2 of the first pixel SP1 may include an active region ACT2, a gate electrode GE2, a drain electrode DE2, and a source electrode SE2. The active region ACT2 of the second transistor ST2 may be disposed in the active layer ACTL and may overlap the gate electrode GE2 of the second transistor ST2 in the thickness direction (Z-axis direction).

The gate electrode GE2 of the second transistor ST2 may be disposed in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the first data line DL1 through the third connection electrode CE3. The drain electrode DE2 of the second transistor ST2 may receive the data voltage of the first pixel SP1 from the first data line DL1.

The source electrode SE2 of the second transistor ST2 may be connected to the second connection electrode CE2 of the second metal layer MTL2 through the third contact hole CNT3. The second connection electrode CE2 may be connected to the first capacitor electrode CPE1 of the first metal layer MTL1 through the third contact hole CNT3. Accordingly, the second connection electrode CE2 may electrically connect the source electrode SE2 of the second transistor ST2 to the first capacitor electrode CPE1.

The third transistor ST3 of the first pixel SP1 may include an active region ACT3, a gate electrode GE3, a drain electrode DE3, and a source electrode SE3. The active region ACT3 of the third transistor ST3 may be disposed in the active layer ACTL and may overlap the gate electrode GE3 of the third transistor ST3 in the thickness direction (Z-axis direction).

The gate electrode GE3 of the third transistor ST3 may be disposed in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be integrally formed with the second capacitor electrode CPE2 of the first capacitor C1. Therefore, the display device 10 may not include a separate contact hole for connecting the drain electrode DE3 of the third transistor ST3 to the second capacitor electrode CPE2 of the first capacitor C1, and may increase the capacitance of the first capacitor C1 by securing the area of the first capacitor C1.

The source electrode SE3 of the third transistor ST3 may be connected to the fourth connection electrode CE4 of the second metal layer MTL2 through the fifth contact hole CNT5. The fourth connection electrode CE4 may electrically connect the source electrode SE3 of the third transistor ST3 to the initialization voltage line VIL through the fifth contact hole CNT5. The source electrode SE3 of the third transistor ST3 may receive the initialization voltage from the initialization voltage line VIL. The source electrode SE3 of the third transistor ST3 may supply the sensing signal to the initialization voltage line VIL.

The pixel circuit of the second pixel SP2 may include first to third transistors ST1, ST2, and ST3. The first transistor ST1 of the second pixel SP2 may include an active region ACT1, a gate electrode GE1, a drain electrode DE1, and a source electrode SE1. The active region ACT1 of the first transistor ST1 may be disposed in the active layer ACTL and may overlap the gate electrode GE1 of the first transistor ST1 in the thickness direction (Z-axis direction).

The gate electrode GE1 of the first transistor ST1 may be disposed in the second metal layer MTL2. The gate electrode GE1 of the first transistor ST1 may be a portion of a sixth connection electrode CE6. The sixth connection electrode CE6 may be connected to the third capacitor electrode CPE3 of the first capacitor C1 disposed in the first metal layer MTL1 through a ninth contact hole CNT9.

The drain electrode DE1 and the source electrode SE1 of the first transistor ST1 may be made conductive by heat treatment of the active layer ACTL. The drain electrode DE1 and the source electrode SE1 may be made conductive as an N-type semiconductor, but are not limited thereto. The fifth connection electrode CE5 may electrically connect the first voltage line VDL to the drain electrode DE1 of the first transistor ST1. The drain electrode DE1 of the first transistor ST1 may receive the driving voltage from the first voltage line VDL.

The source electrode SE1 of the first transistor ST1 may be integrally formed with the fourth capacitor electrode CPE4 of the first capacitor C1. Therefore, the display device 10 may not include a separate contact hole for connecting the source electrode SE1 of the first transistor ST1 to the fourth capacitor electrode CPE4 of the first capacitor C1, and may increase the capacitance of the first capacitor C1 by securing the area of the first capacitor C1.

The first capacitor C1 may be formed between the third capacitor electrode CPE3 of the first metal layer MTL1 and the fourth capacitor electrode CPE4 of the active layer ACTL. The fourth capacitor electrode CPE4 may be disposed on the third capacitor electrode CPE3 to reduce or minimize coupling capacitance between the third capacitor electrode CPE3 and the second electrode of the third metal layer and prevent horizontal crosstalk, thereby improving image quality.

The fourth capacitor electrode CPE4 of the second pixel SP2 may include a second active extension ACTE2 of the active layer ACTL. The second active extension ACTE2 may be integrally formed with the fourth capacitor electrode CPE4 of the second pixel SP2. The second active extension ACTE2 may extend leftward from the fourth capacitor electrode CPE4. The second active extension ACTE2 may be connected to the first electrode or the first contact electrode of the second pixel SP2 through a twelfth contact hole CNT12. Here, the first electrode of the second pixel SP2 may be disposed in the third metal layer, and the first contact electrode of the second pixel SP2 may be disposed in the fourth metal layer. The twelfth contact hole CNT12 may be formed to penetrate the via layer VIA, the passivation layer PV, and the gate insulating layer GI.

The second transistor ST2 of the second pixel SP2 may include an active region ACT2, a gate electrode GE2, a drain electrode DE2, and a source electrode SE2. The active region ACT2 of the second transistor ST2 may be disposed in the active layer ACTL and may overlap the gate electrode GE2 of the second transistor ST2 in the thickness direction (Z-axis direction).

The gate electrode GE2 of the second transistor ST2 may be disposed in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the second data line DL2 through the seventh connection electrode CE7. The drain electrode DE2 of the second transistor ST2 may receive the data voltage of the second pixel SP2 from the second data line DL2.

The source electrode SE2 of the second transistor ST2 may be connected to the sixth connection electrode CE6 of the second metal layer MTL2 through the ninth contact hole CNT9. The sixth connection electrode CE6 may be connected to the third capacitor electrode CPE3 of the first metal layer MTL1 through the ninth contact hole CNT9. Accordingly, the sixth connection electrode CE6 may electrically connect the source electrode SE2 of the second transistor ST2 to the third capacitor electrode CPE3.

The third transistor ST3 of the second pixel SP2 may include an active region ACT3, a gate electrode GE3, a drain electrode DE3, and a source electrode SE3. The active region ACT3 of the third transistor ST3 may be disposed in the active layer ACTL and may overlap the gate electrode GE3 of the third transistor ST3 in the thickness direction (Z-axis direction).

The gate electrode GE3 of the third transistor ST3 may be disposed in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be integrally formed with the fourth capacitor electrode CPE4 of the first capacitor C1. Therefore, the display device 10 may not include a separate contact hole for connecting the drain electrode DE3 of the third transistor ST3 to the fourth capacitor electrode CPE4 of the first capacitor C1, and may increase the capacitance of the first capacitor C1 by securing the area of the first capacitor C1.

The source electrode SE3 of the third transistor ST3 may be connected to the eighth connection electrode CE8 of the second metal layer MTL2 through the eleventh contact hole CNT11. The eighth connection electrode CE8 may electrically connect the source electrode SE3 of the third transistor ST3 to the initialization voltage line VIL through the eleventh contact hole CNT11. The source electrode SE3 of the third transistor ST3 may receive the initialization voltage from the initialization voltage line VIL. The source electrode SE3 of the third transistor ST3 may supply the sensing signal to the initialization voltage line VIL.

The pixel circuit of the third pixel SP3 may include first to third transistors ST1, ST2, and ST3. The first transistor ST1 of the third pixel SP3 may include an active region ACT1, a gate electrode GE1, a drain electrode DE1, and a source electrode SE1. The active region ACT1 of the first transistor ST1 may be disposed in the active layer ACTL and may overlap the gate electrode GE1 of the first transistor ST1 in the thickness direction (Z-axis direction).

The gate electrode GE1 of the first transistor ST1 may be disposed in the second metal layer MTL2. The gate electrode GE1 of the first transistor ST1 may be a part of the ninth connection electrode CE9. The ninth connection electrode CE9 may be connected to the fifth capacitor electrode CPE5 of the first capacitor C1 disposed in the first metal layer MTL1 through a fourteenth contact hole CNT14.

The drain electrode DE1 and the source electrode SE1 of the first transistor ST1 may be made conductive by heat treatment of the active layer ACTL. The drain electrode DE1 and the source electrode SE1 may be made conductive as an N-type semiconductor, but are not limited thereto. The first connection electrode CE1 may electrically connect the first voltage line VDL to the drain electrode DE1 of the first transistor ST1. The drain electrode DE1 of the first transistor ST1 may receive the driving voltage from the first voltage line VDL.

The source electrode SE1 of the first transistor ST1 may be integrally formed with the sixth capacitor electrode CPE6 of the first capacitor C1. Therefore, the display device 10 may not include a separate contact hole for connecting the source electrode SE1 of the first transistor ST1 to the sixth capacitor electrode CPE6 of the first capacitor C1, and may increase the capacitance of the first capacitor C1 by securing the area of the first capacitor C1.

The first capacitor C1 may be formed between the fifth capacitor electrode CPE5 of the first metal layer MTL1 and the sixth capacitor electrode CPE6 of the active layer ACTL. The sixth capacitor electrode CPE6 may be disposed on the fifth capacitor electrode CPE5 to reduce or minimize coupling capacitance between the fifth capacitor electrode CPE5 and the second electrode of the third metal layer and prevent horizontal crosstalk, thereby improving image quality.

The sixth capacitor electrode CPE6 of the third pixel SP3 may include a third active extension ACTE3 of the active layer ACTL. The third active extension ACTE3 may be integrally formed with the sixth capacitor electrode CPE6 of the third pixel SP3. The third active extension ACTE3 may extend rightward from the sixth capacitor electrode CPE6. The third active extension ACTE3 may be connected to the first electrode or the first contact electrode of the third pixel SP3 through a seventeenth contact hole CNT17. Here, the first electrode of the third pixel SP3 may be disposed in the third metal layer, and the first contact electrode of the third pixel SP3 may be disposed in the fourth metal layer. The seventeenth contact hole CNT17 may be formed to penetrate the via layer VIA, the passivation layer PV, and the gate insulating layer GI.

The second transistor ST2 of the third pixel SP3 may include an active region ACT2, a gate electrode GE2, a drain electrode DE2, and a source electrode SE2. The active region ACT2 of the second transistor ST2 may be disposed in the active layer ACTL and may overlap the gate electrode GE2 of the second transistor ST2 in the thickness direction (Z-axis direction).

The gate electrode GE2 of the second transistor ST2 may be disposed in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the third data line DL3 through the tenth connection electrode CE10. The drain electrode DE2 of the second transistor ST2 may receive the data voltage of the third pixel SP3 from the third data line DL3.

The source electrode SE2 of the second transistor ST2 may be connected to the ninth connection electrode CE9 of the second metal layer MTL2 through the fourteenth contact hole CNT14. The ninth connection electrode CE9 may be connected to the fifth capacitor electrode CPE5 of the first metal layer MTL1 through the fourteenth contact hole CNT14. Accordingly, the ninth connection electrode CE9 may electrically connect the source electrode SE2 of the second transistor ST2 to the fifth capacitor electrode CPE5.

The third transistor ST3 of the third pixel SP3 may include an active region ACT3, a gate electrode GE3, a drain electrode DE3, and a source electrode SE3. The active region ACT3 of the third transistor ST3 may be disposed in the active layer ACTL and may overlap the gate electrode GE3 of the third transistor ST3 in the thickness direction (Z-axis direction).

The gate electrode GE3 of the third transistor ST3 may be disposed in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be integrally formed with the sixth capacitor electrode CPE6 of the first capacitor C1. Therefore, the display device 10 may not include a separate contact hole for connecting the drain electrode DE3 of the third transistor ST3 to the sixth capacitor electrode CPE6 of the first capacitor C1, and may increase the capacitance of the first capacitor C1 by securing the area of the first capacitor C1.

The source electrode SE3 of the third transistor ST3 may be connected to the eleventh connection electrode CE11 of the second metal layer MTL2 through the sixteenth contact hole CNT16. The eleventh connection electrode CE11 may electrically connect the source electrode SE3 of the third transistor ST3 to the initialization voltage line VIL through the sixteenth contact hole CNT16. The source electrode SE3 of the third transistor ST3 may receive the initialization voltage from the initialization voltage line VIL. The source electrode SE3 of the third transistor ST3 may supply the sensing signal to the initialization voltage line VIL.

Figure 14:
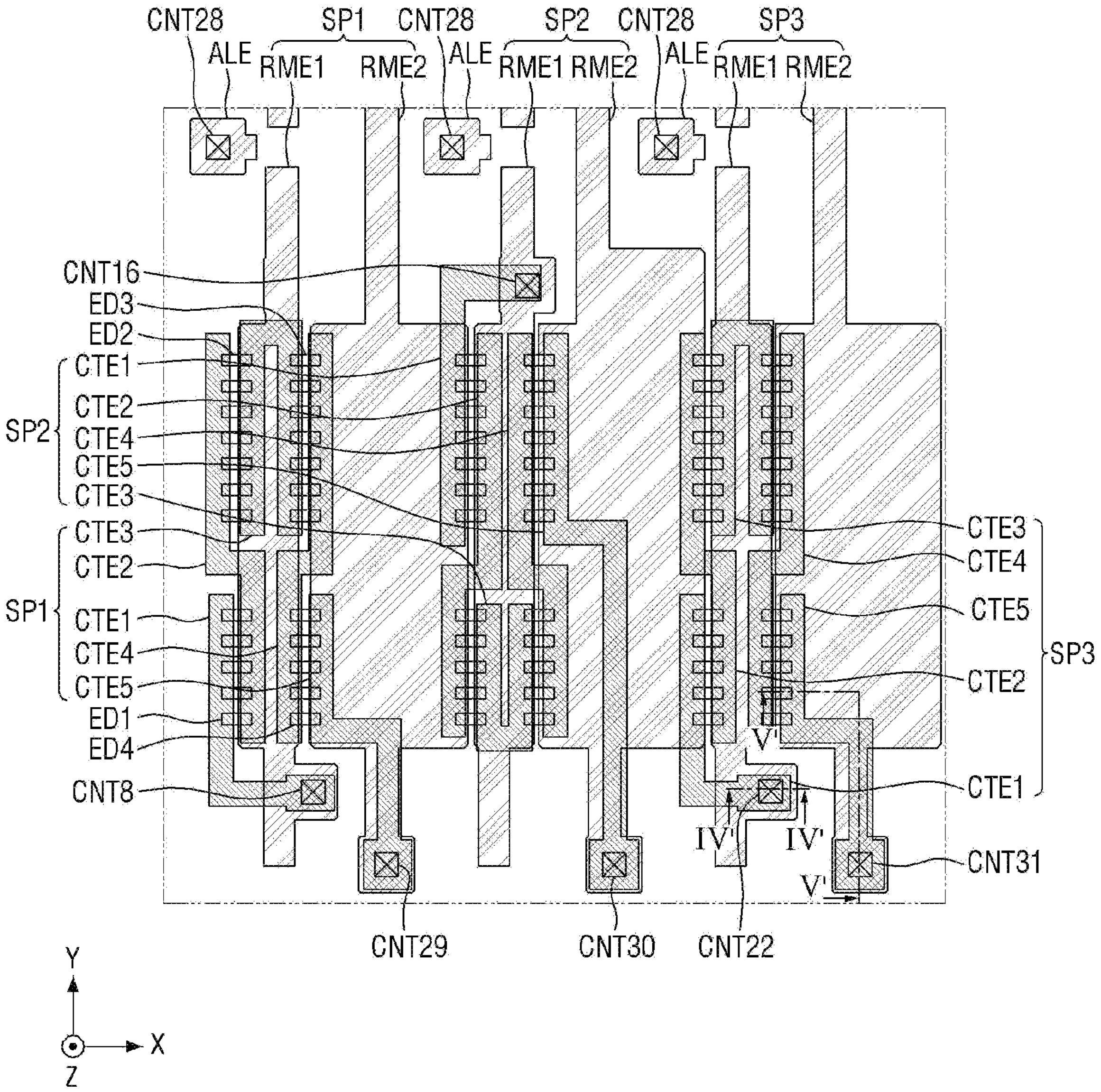
FIG. 14 is a plan view illustrating an example of a light emitting element layer in a display device according to one or more embodiments.
Figure 15:
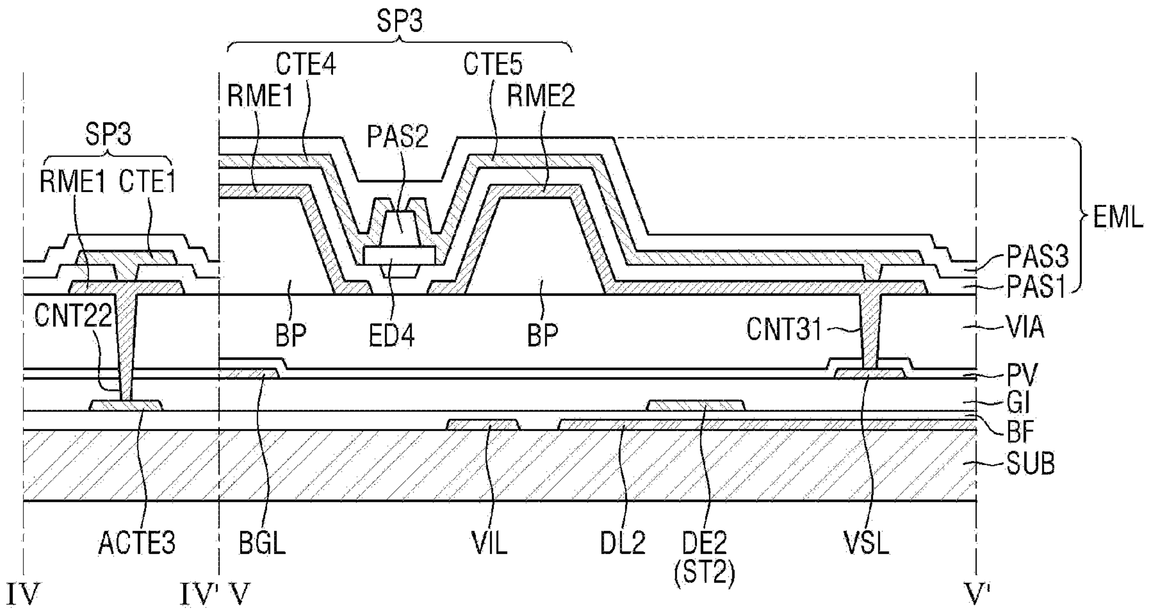
FIG. 15 is a cross-sectional view taken along the lines IV-IV' and V-V' of FIG. 14.

FIG. 14 is a plan view illustrating an example of a light emitting element layer in a display device according to one or more embodiments. FIG. 15 is a cross-sectional view taken along the lines IV-IV' and V-V' of FIG. 14. A light emitting element layer EML of FIGS. 14 and 15 may be disposed on the thin film transistor layer of FIGS. 5 to 9 or the thin film transistor layer of FIGS. 10 to 13.

Referring to FIGS. 14 and 15, the light emitting element layer EML may include a bank pattern BP, first and second electrodes RME1 and RME2, the first to fourth light emitting elements ED1, ED2, ED3, and ED4, a first insulating layer PAS1, a second insulating layer PAS2, first to fifth contact electrodes CTE1, CTE2, CTE3, CTE4, and CTE5, and a third insulating layer PAS3.

The bank pattern BP may protrude upward (in the Z-axis direction) on the via layer VIA. The bank pattern BP may have an inclined side surface. Each of the first to fourth light emitting elements ED1, ED2, ED3, and ED4 may be disposed between the bank patterns BP. The plurality of bank patterns BP may be arranged in an island-shaped pattern over the entire surface of the display area DA.

The first and second electrodes RME1 and RME2 of each of the first to third pixels SP1, SP2, and SP3 may be disposed in the third metal layer MTL3. The third metal layer MTL3 may be disposed on the via layer VIA and the bank pattern BP. The first and second electrodes RME1 and RME2 of each of the first to third pixels SP1, SP2, and SP3 may extend in the second direction (Y-axis direction). The first electrode RME1 of the first pixel SP1 may be disposed to the left side of the second electrode RME2 of the first pixel SP1. The first electrode RME1 of the second pixel SP2 may be disposed between the second electrode RME2 of the first pixel SP1 and the second electrode RME2 of the second pixel SP2. The first electrode RME1 of the third pixel SP3 may be disposed between the second electrode RME2 of the second pixel SP2 and the second electrode RME2 of the third pixel SP3.

Each of the first and second electrodes RME1 and RME2 may cover the top surface and the inclined side surface of the bank pattern BP. Accordingly, each of the first and second electrodes RME1 and RME2 may reflect light emitted from the first to fourth light emitting elements ED1, ED2, ED3, and ED4 in the upward direction (Z-axis direction).

The first electrode RME1 may be separated on a row-by-row basis. The first and second electrodes RME1 and RME2 may be alignment electrodes for aligning the first to fourth light emitting elements ED1, ED2, ED3, and ED4 in the manufacturing process of the display device 10. The first electrode RME1 before being separated may be integrally formed with an alignment electrode ALE, and the alignment electrode ALE may be connected to the horizontal voltage line HVDL of the second metal layer MTL2 through the twenty-eighth contact hole CNT28. The alignment electrode ALE may receive a driving voltage or a high potential voltage from the horizontal voltage line HVDL and supply the high potential voltage to the first electrode RME1. Accordingly, after the alignment process of the plurality of light emitting elements ED is completed, the first electrode RME1 may be separated from the alignment electrode ALE.

The first electrode RME1 of the first pixel SP1 may be connected to the first active extension ACTE1 of the active layer ACTL through the eighth contact hole CNT8. The first electrode RME1 may receive the driving current that has passed through the first transistor ST1. The first electrode RME1 may supply a driving current to the plurality of first light emitting elements ED1 of the first pixel SP1 through the first contact electrode CTE1.

The second electrode RME2 of the first pixel SP1 may be connected to the second voltage line VSL of the second metal layer MTL2 through the twenty-ninth contact hole CNT29. Accordingly, the second electrode RME2 of the first pixel SP1 may receive the low potential voltage from the second voltage line VSL.

The first electrode RME1 of the second pixel SP2 may be connected to the second active extension ACTE2 of the active layer ACTL through the sixteenth contact hole CNT16. The first electrode RME1 may receive the driving current that has passed through the first transistor ST1. The first electrode RME1 may supply a driving current to the plurality of first light emitting elements ED1 of the second pixel SP2 through the first contact electrode CTE1.

The second electrode RME2 of the second pixel SP2 may be connected to the second voltage line VSL of the second metal layer MTL2 through the thirtieth contact hole CNT30. Accordingly, the second electrode RME2 of the second pixel SP2 may receive the low potential voltage from the second voltage line VSL.

The first electrode RME1 of the third pixel SP3 may be connected to the third active extension ACTE3 of the active layer ACTL through the twenty-second contact hole CNT22. The first electrode RME1 may receive the driving current that has passed through the first transistor ST1. The first electrode RME1 may supply a driving current to the plurality of first light emitting elements ED1 of the third pixel SP3 through the first contact electrode CTE1.

The second electrode RME2 of the third pixel SP3 may be connected to the second voltage line VSL of the second metal layer MTL2 through the thirty-first contact hole CNT31. Accordingly, the second electrode RME2 of the third pixel SP3 may receive a low potential voltage from the second voltage line VSL.

The first to fourth light emitting elements ED1, ED2, ED3, and ED4 may be aligned between the first electrode RME1 and the second electrode RME2. The first insulating film PAS1 may cover the first and second electrodes RME1 and RME2. The first to fourth light emitting elements ED1, ED2, ED3, and ED4 may be insulated from the first and second electrodes RME1 and RME2 by the first insulating layer PAS1. Before the first electrode RME1 is separated from the alignment electrode ALE, each of the first and second electrodes RME1 and RME2 may receive an alignment signal, and an electric field may be formed between the first and second electrodes RME1 and RME2. For example, the plurality of first to fourth light emitting elements ED1, ED2, ED3, and ED4 may be sprayed onto the first and second electrodes RME1 and RME2 through an inkjet printing process, and the plurality of first to fourth light emitting elements ED1, ED2, ED3, and ED4 dispersed in an ink may be aligned by receiving a dielectrophoresis force by an electric field formed between the first and second electrodes RME1 and RME2. Accordingly, the plurality of first to fourth light emitting elements ED1, ED2, ED3, and ED4 may be aligned along the second direction (Y-axis direction) between the first and second electrodes RME1 and RME2.

The first to fifth contact electrodes CTE1, CTE2, CTE3, CTE4, and CTE5 of each of the first to third pixels SP1, SP2, and SP3 may be disposed in the fourth metal layer MTL4. The second insulating layer PAS2 may be disposed on the central portion of the light emitting element ED. The third insulating layer PAS3 may cover the first and second insulating layers PAS1 and PAS2 and the first to fifth contact electrodes CTE1, CTE2, CTE3, CTE4 and CTE5. The second and third insulating layers PAS2 and PAS3 may insulate each of the first to fifth contact electrodes CTE1, CTE2, CTE3, CTE4, and CTE5 from each other.

The first contact electrode CTE1 of the first pixel SP1 may be connected to the first electrode RME1 through a contact hole disposed on the second electrode RME2 of the third pixel SP3 and overlapping the eighth contact hole CNT8. The first contact electrode CTE1 may be connected between the first electrode RME1 and one ends of the plurality of first light emitting elements ED1. The first contact electrode CTE1 may correspond to an anode electrode of the plurality of first light emitting elements ED1, but the present disclosure is not limited thereto.

The second contact electrode CTE2 may be insulated from the first and second electrodes RME1 and RME2. A first portion of the second contact electrode CTE2 may be disposed above the first electrode RME1 of the first pixel SP1 and extend in the second direction (Y-axis direction). A second portion of the second contact electrode CTE2 may extend from the upper side of the first portion thereof. The second portion of the second contact electrode CTE2 may extend in the second direction (Y-axis direction) at the left side of the first electrode RME1 of the first pixel SP1.

The second contact electrode CTE2 may be connected between the other ends of the plurality of first light emitting elements ED1 and one ends of the plurality of second light emitting elements ED2. The second contact electrode CTE2 may correspond to the third node N3 of FIG. 4. The second contact electrode CTE2 may correspond to a cathode electrode of the plurality of first light emitting elements ED1, but is not limited thereto. The second contact electrode CTE2 may correspond to an anode electrode of the plurality of second light emitting elements ED2, but is not limited thereto.

The third contact electrode CTE3 may be insulated from the first and second electrodes RME1 and RME2. A first portion of the third contact electrode CTE3 may be disposed above the first electrode RME1 of the first pixel SP1 and extend in the second direction (Y-axis direction). A second portion of the third contact electrode CTE3 may be disposed above the first electrode RME1 of the first pixel SP1, extend in the second direction (Y-axis direction), and may be disposed to the right side of the first portion thereof. A third portion of the third contact electrode CTE3 may extend in the first direction (X-axis direction) and may connect the first portion and the second portion of the third contact electrode CTE3.

The third contact electrode CTE3 may be connected between the other ends of the plurality of second light emitting elements ED2 and one ends of the plurality of third light emitting elements ED3. The third contact electrode CTE3 may correspond to the fourth node N4 of FIG. 4. The third contact electrode CTE3 may correspond to a cathode electrode of the plurality of second light emitting elements ED2, but is not limited thereto. The third contact electrode CTE3 may correspond to the anode electrodes of the plurality of third light emitting elements ED3, but is not limited thereto.

The fourth contact electrode CTE4 may be insulated from the first and second electrodes RME1 and RME2. A first portion of the fourth contact electrode CTE4 may be disposed above the second electrode RME2 of the first pixel SP1 and extend in the second direction (Y-axis direction). A second portion of the fourth contact electrode CTE4 may extend from the lower side of the first portion thereof. The second portion of the fourth contact electrode CTE4 may be disposed above the first electrode RME1 of the first pixel SP1 and extend in the second direction (Y-axis direction).

The fourth contact electrode CTE4 may be connected between the other ends of the plurality of third light emitting elements ED3 and one ends of the plurality of fourth light emitting elements ED4. The fourth contact electrode CTE4 may correspond to the fifth node N5 of FIG. 4. The fourth contact electrode CTE4 may correspond to a cathode electrode of the plurality of third light emitting elements ED3, but is not limited thereto. The fourth contact electrode CTE4 may correspond to an anode electrode of the plurality of fourth light emitting elements ED4, but is not limited thereto.

The fifth contact electrode CTE5 may be connected between the second electrode RME2 and the other ends of the plurality of fourth light emitting elements ED4. A first portion of the fifth contact electrode CTE5 may be disposed above the second electrode RME2 of the first pixel SP1 and extend in the second direction (Y-axis direction). A second portion of the fifth contact electrode CTE5 may extend from the lower side of the first portion. The second portion of the fifth contact electrode CTE5 may extend from the first portion thereof to the upper portion of the twenty-ninth contact hole CNT29. The fifth contact electrode CTE5 may correspond to the cathode electrodes of the plurality of fourth light emitting elements ED4, but is not limited thereto. The fifth contact electrode CTE5 may receive a low potential voltage through the second electrode RME2.

Figure 16:
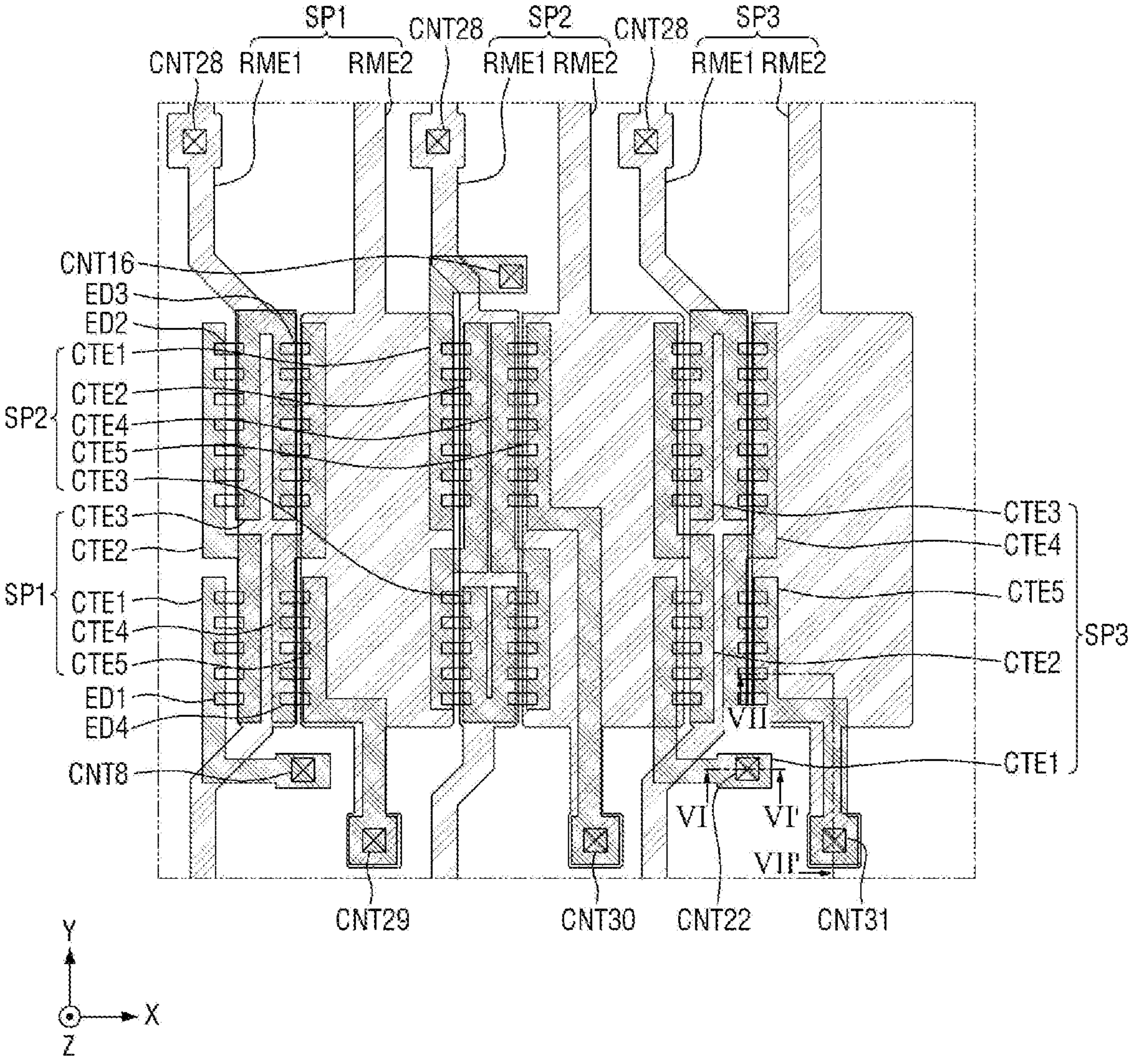
FIG. 16 is a plan view illustrating another example of a light emitting element layer in a display device according to one or more embodiments.
Figure 17:
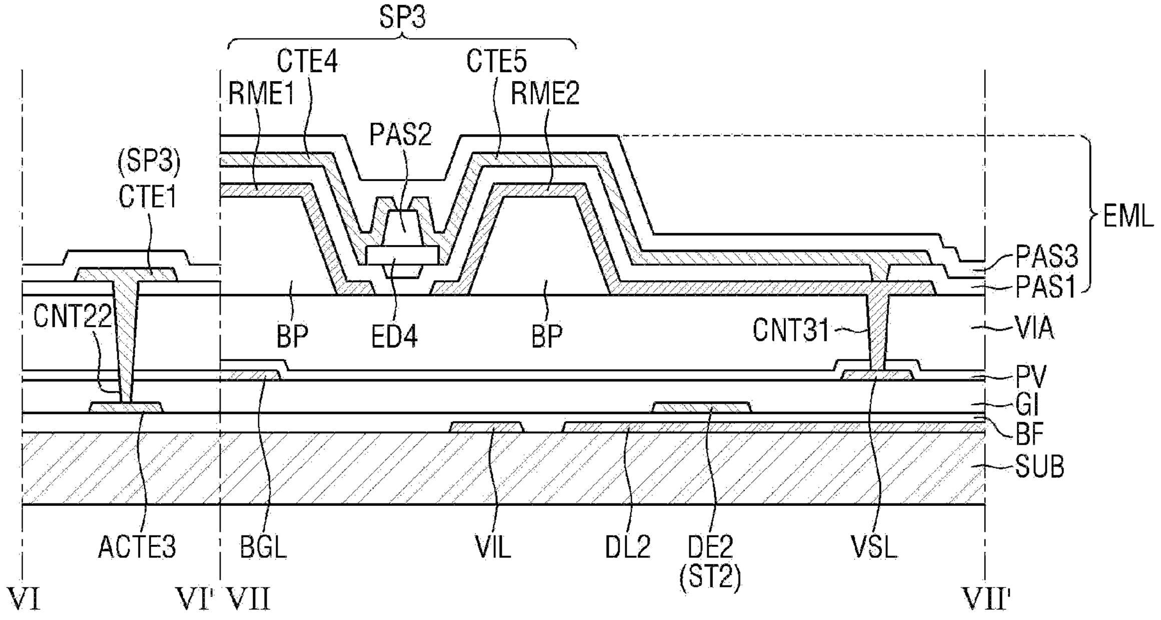
FIG. 17 is a cross-sectional view taken along the lines VI-VI' and VII-VII' of FIG. 16.

FIG. 16 is a plan view illustrating an example of a light emitting element layer in a display device according to one or more embodiments. FIG. 17 is a cross-sectional view taken along the lines VI-VI' and VII-VII' of FIG. 16. The light emitting element layer EML of FIGS. 16 and 17 may be disposed on the thin film transistor layer of FIGS. 5 to 9 or the thin film transistor layer of FIGS. 10 to 13.

Referring to FIGS. 16 and 17, the light emitting element layer EML may include the bank pattern BP, the first and second electrodes RME1 and RME2, the first to fourth light emitting elements ED1, ED2, ED3, and ED4, the first insulating layer PAS1, the second insulating layer PAS2, the first to fifth contact electrodes CTE1, CTE2, CTE3, CTE4, and CTE5, and the third insulating layer PAS3.

The first electrode RME1 of the first pixel SP1 may be connected to the horizontal voltage line HVDL of the second metal layer MTL2 through the twenty-eighth contact hole CNT28. The first electrode RME1 of the first pixel SP1 may be insulated from the first active extension ACTE1. The second electrode RME2 of the first pixel SP1 may be connected to the second voltage line VSL of the second metal layer MTL2 through the twenty-ninth contact hole CNT29. The first electrode RME1 may receive a driving voltage or a high potential voltage from the horizontal voltage line HVDL, and the second electrode RME2 may receive a low potential voltage from the second voltage line VSL. Accordingly, the first and second electrodes RME1 and RME2 may be alignment electrodes for aligning the first to fourth light emitting elements ED1, ED2, ED3, and ED4 in the manufacturing process of the display device 10.

The first electrode RME1 of the second pixel SP2 may be connected to the horizontal voltage line HVDL of the second metal layer MTL2 through the twenty-eighth contact hole CNT28. The first electrode RME1 of the second pixel SP2 may be insulated from the second active extension ACTE2. The second electrode RME2 of the second pixel SP2 may be connected to the second voltage line VSL of the second metal layer MTL2 through the thirtieth contact hole CNT30.

The first electrode RME1 of the third pixel SP3 may be connected to the horizontal voltage line HVDL of the second metal layer MTL2 through the twenty-eighth contact hole CNT28. The first electrode RME1 of the third pixel SP3 may be insulated from the third active extension ACTE3. The second electrode RME2 of the third pixel SP3 may be connected to the second voltage line VSL of the second metal layer MTL2 through the thirty-first contact hole CNT31.

The first to fifth contact electrodes CTE1, CTE2, CTE3, CTE4, and CTE5 of each of the first to third pixels SP1, SP2, and SP3 may be disposed in the fourth metal layer MTL4. The first contact electrode CTE1 of each of the first to third pixels SP1, SP2, and SP3 may be insulated from the first electrode RME1 of each of the first to third pixels SP1, SP2, and SP3.

The first contact electrode CTE1 of the first pixel SP1 may be connected between the first active extension ACTE1 and one ends of the plurality of first light emitting elements ED1. A first portion of the first contact electrode CTE1 may be inserted into the eighth contact hole CNT8 to be connected to the first active extension ACTE1 of the active layer ACTL. A second portion of the first contact electrode CTE1 may extend in the second direction (Y-axis direction) at the left side of the first electrode RME1.

The second contact electrode CTE2 may be connected between the other ends of the plurality of first light emitting elements ED1 and one ends of the plurality of second light emitting elements ED2. The second contact electrode CTE2 may correspond to the third node N3 of FIG. 4. The third contact electrode CTE3 may be connected between the other ends of the plurality of second light emitting elements ED2 and one ends of the plurality of third light emitting elements ED3. The third contact electrode CTE3 may correspond to the fourth node N4 of FIG. 4. The fourth contact electrode CTE4 may be connected between the other ends of the plurality of third light emitting elements ED3 and one ends of the plurality of fourth light emitting elements ED4. The fourth contact electrode CTE4 may correspond to the fifth node N5 of FIG. 4. The fifth contact electrode CTE5 may be connected between the second electrode RME2 and the other ends of the plurality of fourth light emitting elements ED4. The fifth contact electrode CTE5 may receive a low potential voltage through the second electrode RME2.

The first contact electrode CTE1 of the second pixel SP2 may be inserted into the sixteenth contact hole CNT16 to be connected to the second active extension ACTE2 of the active layer ACTL. The first contact electrode CTE1 may be connected between the second active extension ACTE2 and one ends of the plurality of first light emitting elements ED1. The fifth contact electrode CTE5 of the second pixel SP2 may receive a low potential voltage through the second electrode RME2.

The first contact electrode CTE1 of the third pixel SP3 may be inserted into the twenty-second contact hole CNT22 to be connected to the third active extension ACTE3 of the active layer ACTL. The first contact electrode CTE1 may be connected between the third active extension ACTE3 and one ends of the plurality of first light emitting elements ED1. The fifth contact electrode CTE5 of the third pixel SP3 may receive a low potential voltage through the second electrode RME2.

Figure 18:
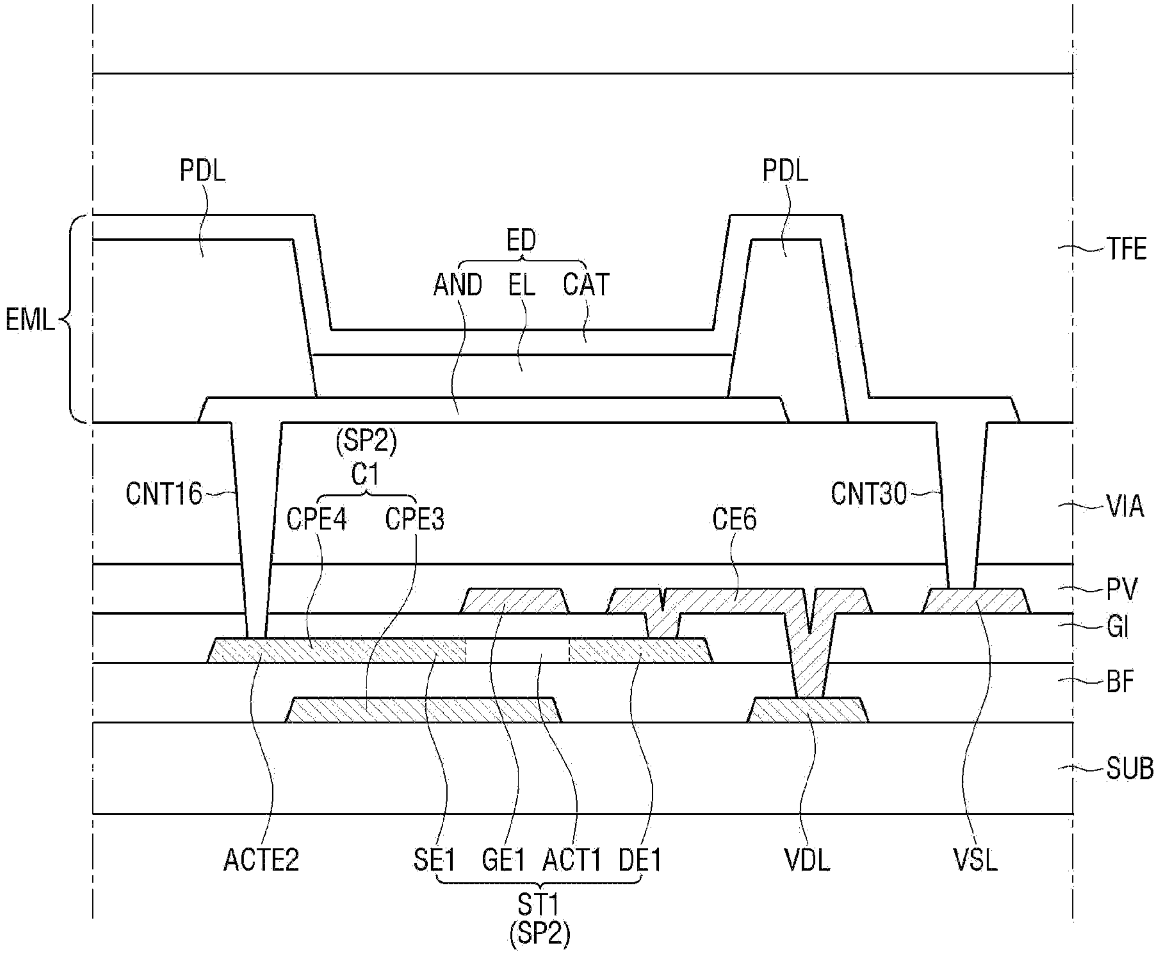
FIG. 18 is a cross-sectional view illustrating an example of a light emitting element layer in a display device according to one or more embodiments.

FIG. 18 is a cross-sectional view illustrating an example of a light emitting element layer in a display device according to one or more embodiments.

Referring to FIG. 18, the light emitting element layer EML may include the light emitting element ED and a pixel defining layer PDL.

The light emitting element ED may include a pixel electrode AND, a light emitting layer EL, and a common electrode CAT.

The pixel electrode AND may be disposed in the third metal layer MTL3 on the via layer VIA. The pixel electrode AND may overlap an emission area or an opening area defined by the pixel defining layer PDL. The pixel electrode AND may be connected to the second active extension ACTE2 of the active layer ACTL through the sixteenth contact hole CNT16.

The light emitting layer EML may be disposed on the pixel electrode AND. For example, the light emitting layer EML may be an organic light emitting layer made of an organic material, but is not limited thereto. In the case of employing the organic light emitting layer as the light emitting layer EML, the first transistor ST1 applies a suitable voltage (e.g., a predetermined voltage) to the pixel electrode AND of the light emitting element ED, and if the common electrode CAT of the light emitting element ED receives a common voltage or a low potential voltage, the holes and electrons can move to the light emitting layer EML through the hole transport layer and the electron transport layer and combine to produce light to be emitted by the light emitting layer EML.

The common electrode CAT may be arranged on the light emitting layer EML. For example, the common electrode CAT may be made in the form of an electrode common to all of the pixels SP rather than specific to each of the pixels SP. The common electrode CAT may be disposed on the light emitting layer EML in the emission area, and may be disposed on the pixel defining layer PDL or the via layer VIA in an area other than the emission area.

The common electrode CAT may be connected to the second voltage line VSL of the second metal layer MTL2 through the thirtieth contact hole CNT30. The common electrode CAT may receive the common voltage or a low potential voltage. When the pixel electrode AND receives a voltage corresponding to a data voltage and the common electrode CAT receives the low potential voltage, a potential difference is formed between the pixel electrode AND and the common electrode CAT, so that the light emitting layer EML may emit light.

The pixel defining layer PDL may define a plurality of emission areas. The pixel defining layer PDL may separate and insulate the pixel electrode AND of each of the plurality of light emitting elements ED. For example, the pixel defining layer PDL may include a light absorbing material and may prevent light reflection, but is not limited thereto.

An encapsulation layer TFE may be disposed on the light emitting element layer EML to cover the plurality of light emitting elements ED. The encapsulation layer TFE may include at least one inorganic layer to prevent oxygen or moisture from penetrating into the light emitting element layer EML. The encapsulation layer TFE may include at least one organic layer to protect the light emitting element layer EML from foreign matters such as dust.

What is claimed is:

1. A display device comprising:

a substrate;

a first voltage line in a first metal layer on the substrate and extending in a first direction;

a horizontal gate line in a second metal layer on the first metal layer and extending in a second direction crossing the first direction;

a pixel circuit of a first pixel and a pixel circuit of a second pixel in the first metal layer, the second metal layer, and an active layer between the first and second metal layers; and a shielding line connected to the first voltage line and extending in the second direction, the shielding line being located between the pixel circuit of the first pixel and the pixel circuit of the second pixel, wherein the shielding line is in the first metal layer and integrally formed with the first voltage line.

2. The display device of claim 1, wherein the pixel circuit of the first pixel comprises:

a first capacitor electrode at one side of the shielding line in the first metal layer; and a second capacitor electrode in the active layer and overlapping the first capacitor electrode, and wherein the pixel circuit of the second pixel comprises:

a third capacitor electrode at an other side of the shielding line in the first metal layer; and a fourth capacitor electrode in the active layer and overlapping the third capacitor electrode.

3. The display device of claim 2, wherein the pixel circuit of the first pixel further comprises a first transistor, wherein the first transistor of the first pixel comprises:

a drain electrode in the active layer and electrically connected to the first voltage line;

a source electrode in the active layer and integrally formed with the second capacitor electrode; and a gate electrode in the second metal layer.

4. The display device of claim 3, further comprising:

a first connection electrode in the second metal layer and electrically connecting the first voltage line to the drain electrode of the first transistor; and a second connection electrode in the second metal layer, integrally formed with the gate electrode of the first transistor, and connected to the first capacitor electrode.

5. The display device of claim 3, further comprising:

a first active extension in the active layer and extending from the second capacitor electrode;

a first electrode in a third metal layer on the second metal layer and connected to the first active extension;

a first contact electrode in a fourth metal layer on the third metal layer and connected to the first electrode; and a light emitting element connected to the first contact electrode.

6. The display device of claim 5, further comprising:

a second electrode parallel to the first electrode in the third metal layer;

a second contact electrode in the fourth metal layer and connected to the light emitting element; and a second voltage line extending in the second direction in the second metal layer and connected to the second electrode.

7. The display device of claim 3, further comprising:

a first active extension in the active layer and extending from the second capacitor electrode;

a first electrode in a third metal layer on the second metal layer and extending in the first direction;

a first contact electrode in a fourth metal layer on the third metal layer, connected to the first active extension, and insulated from the first electrode; and a light emitting element connected to the first contact electrode.

8. The display device of claim 3, further comprising:

a first active extension in the active layer and extending from the second capacitor electrode;

a pixel electrode in a third metal layer on the second metal layer and connected to the first active extension;

a light emitting layer on the pixel electrode;

a common electrode on the light emitting layer; and a second voltage line extending in the second direction in the second metal layer and connected to the common electrode.

9. The display device of claim 1, wherein the shielding line comprises:

a first shielding line in the first metal layer and integrally formed with the first voltage line; and a second shielding line in the second metal layer and overlapping the first shielding line.

10. The display device of claim 9, wherein the pixel circuit of the first pixel comprises:

a first capacitor electrode at one side of the first shielding line in the first metal layer; and a second capacitor electrode in the active layer and overlapping the first capacitor electrode, and wherein the pixel circuit of the second pixel comprises:

a third capacitor electrode at an other side of the first shielding line in the first metal layer; and a fourth capacitor electrode in the active layer and overlapping the third capacitor electrode.

11. The display device of claim 10, wherein the pixel circuit of the first pixel further comprises a first transistor, wherein the first transistor of the first pixel comprises:

a drain electrode in the active layer and electrically connected to the first voltage line;

a source electrode in the active layer and integrally formed with the second capacitor electrode; and a gate electrode in the second metal layer.

12. The display device of claim 11, further comprising:

a first connection electrode in the second metal layer and electrically connecting the first voltage line to the drain electrode of the first transistor; and a second connection electrode in the second metal layer, integrally formed with the gate electrode of the first transistor, and connected to the first capacitor electrode.

13. The display device of claim 12, wherein the second shielding line is in the second metal layer and integrally formed with the first connection electrode.

14. A display device comprising:

a substrate;

a first voltage line in a first metal layer on the substrate and extending in a first direction;

a pixel circuit of a first pixel and a pixel circuit of a second pixel in the first metal layer, an active layer on the first metal layer, and a second metal layer on the active layer; and a shielding line in the first metal layer, the shielding line being integrally formed with the first voltage line, and located between the pixel circuit of the first pixel and the pixel circuit of the second pixel.

15. The display device of claim 14, wherein the pixel circuit of the first pixel comprises:

a first capacitor electrode at one side of the shielding line in the first metal layer; and a second capacitor electrode in the active layer and overlapping the first capacitor electrode, and wherein the pixel circuit of the second pixel comprises:

a third capacitor electrode at an other side of the shielding line in the first metal layer; and a fourth capacitor electrode in the active layer and overlapping the third capacitor electrode.

16. The display device of claim 15, wherein the pixel circuit of the first pixel further comprises a first transistor, wherein the first transistor of the first pixel comprises:

a drain electrode in the active layer and electrically connected to the first voltage line;

a source electrode in the active layer and integrally formed with the second capacitor electrode; and a gate electrode in the second metal layer.

17. A display device comprising:

a substrate;

a first voltage line in a first metal layer on the substrate and extending in a first direction;

a pixel circuit of a first pixel and a pixel circuit of a second pixel in the first metal layer, an active layer on the first metal layer, and a second metal layer on the active layer; and a shielding line between the pixel circuit of the first pixel and the pixel circuit of the second pixel, wherein the shielding line comprises:

a first shielding line in the first metal layer and integrally formed with the first voltage line; and a second shielding line in the second metal layer and overlapping the first shielding line.

18. The display device of claim 17, wherein the pixel circuit of the first pixel comprises:

a first capacitor electrode at one side of the first shielding line in the first metal layer; and a second capacitor electrode in the active layer and overlapping the first capacitor electrode, and wherein the pixel circuit of the second pixel comprises:

a third capacitor electrode at an other side of the first shielding line in the first metal layer; and a fourth capacitor electrode in the active layer and overlapping the third capacitor electrode.

19. The display device of claim 18, wherein the pixel circuit of the first pixel further comprises a first transistor, wherein the first transistor of the first pixel comprises:

a drain electrode in the active layer and electrically connected to the first voltage line;

a source electrode in the active layer and integrally formed with the second capacitor electrode; and a gate electrode in the second metal layer.

* * * * *